United States Patent
Chu et al.

(10) Patent No.: US 9,496,137 B2
(45) Date of Patent: Nov. 15, 2016

(54) METHODS OF FORMING REVERSE SIDE ENGINEERED III-NITRIDE DEVICES

(71) Applicant: Transphorm Inc., Goleta, CA (US)

(72) Inventors: Rongming Chu, Goleta, CA (US); Umesh Mishra, Montecito, CA (US); Rakesh K. Lal, Isla Vista, CA (US)

(73) Assignee: Transphorm Inc., Goleta, CA (US)

( * ) Notice: Subject to any disclaimer, the term of this patent is extended or adjusted under 35 U.S.C. 154(b) by 657 days.

(21) Appl. No.: 13/756,284

(22) Filed: Jan. 31, 2013

(65) Prior Publication Data

US 2013/0210220 A1 Aug. 15, 2013

Related U.S. Application Data

(62) Division of application No. 12/635,405, filed on Dec. 10, 2009, now Pat. No. 8,389,977.

(51) Int. Cl.
*H01L 29/06* (2006.01)
*H01L 21/02* (2006.01)
(Continued)

(52) U.S. Cl.
CPC ....... *H01L 21/0254* (2013.01); *H01L 29/4175* (2013.01); *H01L 29/66462* (2013.01); *H01L 29/7786* (2013.01); *H01L 23/291* (2013.01); *H01L 23/3171* (2013.01); *H01L 24/03* (2013.01); *H01L 24/06* (2013.01); *H01L 29/2003* (2013.01); *H01L 29/42316* (2013.01); *H01L 2224/03002* (2013.01); *H01L 2224/03462* (2013.01); *H01L 2224/03464* (2013.01); *H01L 2224/04042* (2013.01); *H01L 2224/06183* (2013.01); *H01L 2224/94* (2013.01); *H01L 2924/01029* (2013.01); *H01L 2924/1032* (2013.01);
(Continued)

(58) Field of Classification Search
CPC .................. H01L 21/0254; H01L 29/4175
See application file for complete search history.

(56) References Cited

U.S. PATENT DOCUMENTS

| 4,645,562 A | 2/1987 | Liao et al. |
| 4,728,826 A | 3/1988 | Einzinger et al. |

(Continued)

FOREIGN PATENT DOCUMENTS

| CN | 1748320 | 3/2006 |
| CN | 101107713 | 1/2008 |

(Continued)

OTHER PUBLICATIONS

U.S. Appl. No. 11/856,695, filed Sep. 17, 2007, Gallium Nitride Diodes and Integrated Components.

(Continued)

*Primary Examiner* — Mark Tornow
(74) *Attorney, Agent, or Firm* — Fish & Richardson P.C.

(57) ABSTRACT

Group III-nitride devices are described that include a stack of III-nitride layers, passivation layers, and conductive contacts. The stack includes a channel layer with a 2DEG channel, a barrier layer and a spacer layer. One passivation layer directly contacts a surface of the spacer layer on a side opposite to the channel layer and is an electrical insulator. The stack of III-nitride layers and the first passivation layer form a structure with a reverse side proximate to the first passivation layer and an obverse side proximate to the barrier layer. Another passivation layer is on the obverse side of the structure. Defected nucleation and stress management layers that form a buffer layer during the formation process can be partially or entirely removed.

9 Claims, 25 Drawing Sheets

(51) Int. Cl.
*H01L 29/417* (2006.01)
*H01L 29/66* (2006.01)
*H01L 29/778* (2006.01)
H01L 23/29 (2006.01)
H01L 23/31 (2006.01)
H01L 29/20 (2006.01)
H01L 29/423 (2006.01)
H01L 23/00 (2006.01)

(52) U.S. Cl.
CPC .......... *H01L 2924/12032* (2013.01); *H01L 2924/12042* (2013.01); *H01L 2924/13062* (2013.01); *H01L 2924/13064* (2013.01)

(56) References Cited

U.S. PATENT DOCUMENTS

| | | |
|---|---|---|
| 4,821,093 A | 4/1989 | Iafrate et al. |
| 4,914,489 A | 4/1990 | Awano |
| 5,329,147 A | 7/1994 | Vo et al. |
| 5,646,069 A | 7/1997 | Jelloian et al. |
| 5,705,847 A | 1/1998 | Kashiwa et al. |
| 5,714,393 A | 2/1998 | Wild et al. |
| 5,998,810 A | 12/1999 | Hatano et al. |
| 6,008,684 A | 12/1999 | Ker et al. |
| 6,097,046 A | 8/2000 | Plumton |
| 6,292,500 B1 | 9/2001 | Kouchi et al. |
| 6,316,793 B1 | 11/2001 | Sheppard et al. |
| 6,475,889 B1 | 11/2002 | Ring |
| 6,486,502 B1 | 11/2002 | Sheppard et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,125,786 B2 | 10/2006 | Ring et al. |
| 7,126,212 B2 | 10/2006 | Enquist et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,501,669 B2 | 3/2009 | Parikh et al. |
| 7,544,963 B2 | 6/2009 | Saxler |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,777,252 B2 | 8/2010 | Sugimoto et al. |
| 7,795,642 B2 | 9/2010 | Suh et al. |
| 7,812,369 B2 | 10/2010 | Chini et al. |
| 7,851,825 B2 | 12/2010 | Suh et al. |
| 7,855,401 B2 | 12/2010 | Sheppard et al. |
| 7,875,537 B2 | 1/2011 | Suvorov et al. |
| 7,875,907 B2 | 1/2011 | Honea et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |
| 7,960,756 B2 | 6/2011 | Sheppard et al. |
| 7,965,126 B2 | 6/2011 | Honea et al. |
| 7,985,986 B2 | 7/2011 | Heikman et al. |
| 8,049,252 B2 | 11/2011 | Smith et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,531,232 B2 | 9/2013 | Honea et al. |
| 8,541,818 B2 | 9/2013 | Wu et al. |
| 8,592,974 B2 | 11/2013 | Wu |
| 8,598,937 B2 | 12/2013 | Lal et al. |
| 8,624,662 B2 | 1/2014 | Parikh et al. |
| 8,633,518 B2 | 1/2014 | Suh et al. |
| 8,643,062 B2 | 2/2014 | Parikh et al. |
| 8,648,643 B2 | 2/2014 | Wu |
| 8,692,294 B2 | 4/2014 | Chu et al. |
| 8,716,141 B2 | 5/2014 | Dora et al. |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0001235 A1* | 1/2005 | Murata ............... H01L 29/7787 257/192 |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |
| 2005/0253168 A1 | 11/2005 | Wu et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |

(56) References Cited

U.S. PATENT DOCUMENTS

| | | |
|---|---|---|
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0278518 A1 | 12/2007 | Chen et al. |
| 2007/0295985 A1 | 12/2007 | Weeks, Jr. et al. |
| 2008/0054247 A1 | 3/2008 | Eichler et al. |
| 2008/0073670 A1 | 3/2008 | Yang et al. |
| 2008/0093621 A1 | 4/2008 | Takeda et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0308813 A1 | 12/2008 | Suh et al. |
| 2009/0001478 A1* | 1/2009 | Okamoto .......... H01L 21/76898 257/382 |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0121775 A1* | 5/2009 | Ueda ................ H01L 29/739 327/427 |
| 2009/0146185 A1 | 6/2009 | Suh et al. |
| 2009/0201072 A1 | 8/2009 | Honea et al. |
| 2009/0218598 A1 | 9/2009 | Goto |
| 2009/0278144 A1 | 11/2009 | Sonobe et al. |
| 2010/0067275 A1 | 3/2010 | Wang et al. |
| 2011/0006346 A1 | 1/2011 | Ando et al. |
| 2011/0012110 A1 | 1/2011 | Sazawa et al. |
| 2011/0140172 A1 | 6/2011 | Chu et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 13/954,772, filed Jul. 30, 2013, Enhancement Mode III-N HEMTs.
U.S. Appl. No. 61/099,451, filed Sep. 23, 2008, Inductive Load Power Switching Circuits.
U.S. Appl. No. 13/959,483, filed Aug. 5, 2013, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low EMI Circuits.
U.S. Appl. No. 13/756,284, filed Jan. 31, 2013, Methods of Forming Reverse Side Engineered III-Nitride Devices.
U.S. Appl. No. 12/465,968, filed May 14, 2009, High Voltage III-Nitride Semiconductor Devices.

(56) References Cited

OTHER PUBLICATIONS

U.S. Appl. No. 14/262,649, filed Apr. 25, 2014, High Voltage III-Nitride Semiconductor Devices.
U.S. Appl. No. 14/178,701, filed Feb. 12, 2014, Semiconductor Devices with Field Plates.
U.S. Appl. No. 12/684,838, filed Jan. 8, 2010, Electronic Devices and Components for High Efficiency Power Circuits.
U.S. Appl. No. 14/058,089, filed Oct. 18, 2013, Semiconductor Electronic Components and Circuits.
U.S. Appl. No. 12/968,704, filed Dec. 15, 2010, Transistors with Isolated Regions.
U.S. Appl. No. 14/260,808, filed Apr. 24, 2014, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 14/102,750, filed Dec. 11, 2013, III-N Device Structures and Methods.
U.S. Appl. No. 13/040,524, filed Mar. 4, 2011, Semiconductor Diodes with Low Reverse Bias Currents.
U.S. Appl. No. 14/288,682, filed May 28, 2014, Semiconductor Diodes with Low Reverse Bias Currents.
U.S. Appl. No. 14/211,104, filed Mar. 14, 2014, Electrode Configurations for Semiconductor Devices.
U.S. Appl. No. 61/447,519, filed Feb. 28, 2011, Electronic Components with Reactive Filters.
U.S. Appl. No. 13/403,813, filed Feb. 23, 2012, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 14/179,788, filed Feb. 13, 2014, Electrodes for Semiconductor Devices and Methods of Forming the Same.
U.S. Appl. No. 61/791,395, filed Mar. 15, 2013, Carbon Doping Semiconductor Devices.
U.S. Appl. No. 14/208,304, filed Mar. 13, 2014, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 14/222,992, filed Mar. 24, 2014, Gate Drivers for Circuits Based on Semiconductor Devices.
U.S. Appl. No. 61/844,260, filed Jul. 9, 2013, Multilevel Inverters and their Components.
U.S. Appl. No. 61/856,573, filed Jul. 19, 2013, III-Nitride Transistor Including a P-Type Depleting Layer.
U.S. Appl. No. 14/208,482, filed Mar. 13, 2014, Carbon Doping Semiconductor Devices.
U.S. Appl. No. 13/231,308, filed Sep. 13, 2011, III-N Device Structures Having a Non-Insulating Substrate.
U.S. Appl. No. 14/068,944, filed Oct. 31, 2013, High Power Semiconductor Electronic Components with Increased Reliability.
U.S. Appl. No. 13/535,094, filed Jun. 27, 2012, Semiconductor Devices with Integrated Hole Collectors.
U.S. Appl. No. 13/550,445, filed Jul. 16, 2012, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
U.S. Appl. No. 13/723,753, filed Dec. 21, 2012, Gallium Nitride Power Devices.
U.S. Appl. No. 60/012,755, filed Dec. 10, 2007, Insulated Gate E-Mode Transistors.
U.S. Appl. No. 13/164,109, filed Jun. 20, 2011, Bridge Circuits and their Components.
U.S. Appl. No. 13/108,449, filed Apr. 23, 2008, Enhancement Mode III-N HEMPTs.
U.S. Appl. No. 13/618,502, filed Sep. 14, 2012, Inductive Load Power Switching Circuits.
U.S. Appl. No. 13/618,726, filed Sep. 14, 2012, Inductive Load Power Switching Circuits.
U.S. Appl. No. 13/533,339, filed Jun. 26, 2012, Semiconductor Heterostructure Diodes.
U.S. Appl. No. 13/355,885, filed Jan. 23, 2012, Package Configurations for Low EMI Circuits.
U.S. Appl. No. 12/635,405, filed Dec. 10, 2009, Reverse Side Engineered III-Nitride Devices.
U.S. Appl. No. 12/550,140, filed Aug. 28, 2009, Semiconductor Devices with Field Plates.
U.S. Appl. No. 13/748,907, filed Jan. 24, 2013, Semiconductor Devices with Field Plates.
U.S. Appl. No. 12/701,458, filed Feb. 5, 2010, Semiconductor Electronic Components and Circuits.
U.S. Appl. No. 13/019,733, filed Feb. 2, 2011, III-N Device Structures and Methods.
U.S. Appl. No. 13/040,940, Mar. 4, 2011, Electrode Configurations for Semiconductor Devices.
U.S. Appl. No. 13/405,041, filed Feb. 24, 2012, Semiconductor Power Modules and Devices.
U.S. Appl. No. 13/269,367, filed Oct. 7, 2011, High Power Semiconductor Electronic Components with Increased Reliability.
Authorized officer Agnès Wittmann-Regis, International Preliminary Report on Patentability in PCT/US2013/035837, mailed Oct. 23, 2014, 6 pages.
Authorized officer Yukari Nakamura, International Preliminary Report on Patentability in PCT/US2013/050914, mailed Jan. 29, 2015, 8 pages.
Arulkumaran et al. (2005), "Enhancement of breakdown voltage by AlN buffer layer thickness in AlGaN/GaN high-electron-mobility transistors on 4 in. diameter silicon," Applied Physics Letters, 86:123503-1-3.
Arulkumaran et al., "Surface passivation effects on AlGaN/GaN high-electron-mobility transistors with $SiO_2$, $Si_3N_4$, and silicon oxynitride," Applied Physics Letters, 84(4):613-615, 2004.
Ando et al., "10-W/mm AlGaN-GaN HFET with a field modulating plate," IEEE Electron Device Letters, 2003, 24(5):289-291.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160, mailed Mar. 18, 2009, 11 pages.
Authorized officer Chung Keun Lee, International Search Report and Written Opinion in PCT/US2008/076199, mailed Mar. 24, 2009, 11 pages.
Authorized officer Dorothée Müllhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.

(56) References Cited

OTHER PUBLICATIONS

Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Müllhausen, International Preliminary Report on Patentability in PCT/US2009/041304, mailed Nov. 4, 2010, 8 pages.
Authorized officer Sung Hee Kim, International Search Report and Written Opinion in PCT/US2009/057554, mailed May 10, 2010, 13 pages.
Authorized officer Gijsbertus Beijer, International Preliminary Report on Patentability in PCT/US2009/057554, mailed Apr. 7, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Chung Keun Lee, International Search Report and Written Opinion in PCT/US2009/076030, mailed Mar. 23, 2009, 10 pages.
Authorized officer Yolaine Cussac, International Preliminary Report on Patentability in PCT/US2009/076030, Mar. 25, 2010, 5 pages.
Authorized officer Sung Chan Chung, International Search Report and Written Opinion in PCT/US2010/021824, mailed Aug. 23, 2010, 9 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Choi Jeongmin, International Search Report and Written Opinion in PCT/US2010/046193 mailed Apr. 26, 2011, 13 pages.
Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Barnett and Shinn (1994), "Plastic and elastic properties of compositionally modulated thin films," Annu. Rev. Mater. Sci., 24:481-511.
Chen et al., "High-performance AlGaN/GaN lateral field-effect rectifiers compatible with high electron mobility transistors," Jun. 25, 2008, Applied Physics Letters, 92, 253501-1-3.
Cheng et al. (2006), "Flat GaN epitaxial layers grown on Si(111) by metalorganic vapor phase epitaxy using step-graded AlGaN intermediate layers," Journal of Electronic Materials, 35(4):592-598.
Coffie, R.L., "Characterizing and suppressing DC-to-RF dispersion in AlGaN/GaN high electron mobility transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 39(19):1419-1420, 2003.
Chu et al., "1200-V normally off GaN-on-Si field-effect transistors with low dynamic ON-resistance," IEEE Electron Device Letters, 32(5):632-634, 2011.
Dora, Y., "Understanding material and process limits for high breakdown voltage AlGaN/GaN HEMTs," Diss., University of California, Santa Barbara, 2006.
Dora et al., "$ZrO_2$ gate dielectrics produced by ultraviolet ozone oxidation for GaN and AlGaN/GaN transistors," Mar./Apr. 2006, J. Vac. Sci. Technol. B, 24(2)575-581.
Dora et al., "High breakdown voltage achieved on AlGaN/GaN HEMTs with integrated slant field plates," Sep. 9, 2006, IEEE Electron Device Letters, 27(9):713-715.
Fanciulli et al., "Structural and electrical properties of $HfO_2$ films grown by atomic layer deposition on Si, Ge, GaAs and GaN," 2004, Mat. Res. Soc. Symp. Proc., vol. 786, 6 pp.
Green et al., "The effect of surface passivation on the microwave characteristics of un doped AlGaN/GaN HEMT's," IEEE Electron Device Letters, Jun. 2000, 21(6):268-270.
Gu et al., "AlGaN/GaN MOS transistors using crystalline $ZrO_2$ as gate dielectric," 2007, Proceedings of SPIE, vol. 6473, 64730S-1-8.
Hampson et al., "Polymide passivated AlGan-Gan HFETs with 7.65 W/mm at 18 GHz," IEEE Electron Device Letters, May 2004, 25(5):238-240.
Higashiwaki et al., "AlGan/GaN heterostructure field effect transistors on 4H-Sic substrates with current-gain cutoff frequency of 190 GHz," Applied Physics Express (2008, 021103-1-3.
Hwang et al., "Effects of a molecular beam epitaxy grown AlN passivation layer on AlGaN/GaN heterojunction field effect transistors," Solid-State Electronics, 2004, 48:363-366.
Im et al., "Normally off GaN MOSFET based on AlGaN/GaN heterostructure with extremely high 2DEG density grown on silicon substrate," IEEE Electron Device Letters, 31(3):192-194, 2010.
Karmalkar and Mishra, "Enhancement of breakdown voltage in AlGaN/GaN high electron mobility transistors using a field plate," IEEE Transactions on Electron Devices, 48(8):1515-1521, 2001.
Karmalkar and Mishra, "Very high voltage AlGaN/GaN high electron mobility transistors using a field plate deposited on a stepped insulator," Solid-State Electronics, 2001, 45:1645-1652.
Keller et al. (2002), "GaN-GaN junctions with ultrathin AlN interlayers: expanding heterojunction design," Applied Physics Letters, 80(23):4387-4389.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Khan et al., "AlGan/Gan metal oxide semiconductor heterostructure field effect transistor," IEEE Electron Device Letters, 2000, 21(2):63-65.
Kim, D.H., "Process development and device characteristics of AlGan/GaN HEMTs for high frequency applications," Diss., University of Illinois at Urbana—Champaign, 2008, 120 pages.
Kumar et al., "High transconductance enhancement-mode AlGaN/GaN HEMTs on SiC substrate," Electronics Letters, Nov. 27, 2003, 39(24):1758-1760.
Kuraguchi et al. (2007), "Normally-off GaN-MISFET with well-controlled threshold voltage," Phys. Stats. Sol., 204(6):2010-2013.
Lanford et al., "Recessed-gate enhancement-mode GaN HEMT with high threshold voltage," Mar. 31, 2005, Electronics Letters, vol. 41, No. 7, 2 pages, Online No. 20050161.
Lee et al, "Self-aligned process for emitter- and base-regrowth GaN HBTs and BJTs," Solid-State Electronics, 45:243-247, 2001.
Marchand et al. (2001), "Metalorganic chemical vapor deposition of GaN on Si(111): stress control and application to field-effect transistors," Journal of Applied Physics, 89(12):7846-7851.
Mishra et al., "AlGaN/GaN HEMTs—an overview of device operation and applications," Proceedings of the IEEE 2002, 90(6):1022-1031.
Mishra et al., "Growing N-polar III-nitride structures," U.S. Appl. No. 60/972,467, filed Sep. 14, 2007, 7 pp.
Mishra et al., "N-face high electron mobility transistors with low buffer leakage and low parasitic resistance," U.S. Appl. No. 60/908,914, filed Mar. 29, 2007, 21 pages.
Mishra et al., "Polarization-induced barriers for n-face nitride-based electronics," U.S. Appl. No. 60/940,052, filed May 24, 2007, 29 pages.
Nanjo et al., "Remarkable breakdown voltage enhancement in AlGaN channel high electron mobility transistors," Applied Physics Letters, 2008, 92:263502-1-3.
Napierala et al., "Selective GaN epitaxy on Si(111) substrates using porous aluminum oxide buffer layers," J. Electrochem. Soc., 2006, 153(2): G125-G127.

(56) References Cited

OTHER PUBLICATIONS

Oka and Nozawa (2008), "AlGaN/GaN recessed MIS-Gate HFET with high threshold-voltage normally-off operation for power electronics applications," IEEE Electron Device Letters, 29(7):668-670.
Palacios et al., "AlGaN/GaN HEMTs with an InGaN-based Back-barrier," Device Research Conference Digest, 2005 (DRC '05) 63rd, Jun. 2005, pp. 181-182.
Palacios et al., "AlGaN/GaN High Electron Mobility Transistors with InGaN Back-Barriers," IEEE Electron Device Letters, Jan. 2006, 27(1):13-15.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Palacios et al. (2006), "Nitride-based high electron mobility transistors with a GaN spacer," Applied Physics Letters, 89:073508-1-3.
Pei, Y., et al., "Effect of dielectric thickness on Power performance of AlGaN/GaN HEMTs," IEEE Electron Device Letters, 30(4):313-315, 2009.
"Planar, Low Switching Loss, Gallium Nitride Devices for Power Conversion Applications," SBIR N121-090 (Navy), n.d.
Rajan et al., "Advanced transistor structures based on N-face GaN," 32M International Symposium on Compound Semiconductors (ISCS), Sep. 18-22, 2005, Europa-Park Rust, Germany, 2 pages.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.
Reiher et al. (2003), "Efficient stress relief in GaN heteroepitaxy on SiC (111) using low-temperature AlN interlayers," Journal of Crystal Growth, 248:563-567.
Saito et al. "Recessed-gate structure approach toward Normally off high voltage AlGaN/GaN HEMT for power electronics applications," IEEE Transactions on Electron Devices, 53(2):356-362, 2006.
Shelton et al., "Selective area growth and characterization of AlGaN/GaN heterojunction bipolar transistors by metalorganic chemical vapor deposition," IEEE Transactions on Electron Devices, 2001, 48(3):490-494.
Shen, L., "Advanced polarization-based design of AlGaN/GaN HEMTs," Jun. 2004, PhD Thesis, University of California, Santa Barbara, 191 pp.
SIPO First Office Action for Application No. 200880120050.6, Aug. 2, 2011, 8 pages.
Suh et al., "High breakdown enhancement mode GaN-based HEMTs with integrated slant field plate," U.S. Appl. No. 60/822,886, filed Aug. 18, 2006, 16 pp.
Suh et al., "III-nitride devices with recessed gates," U.S. Appl. No. 60/972,481, filed Sep. 14, 2007, 18 pp.
Suh et al., "High-breakdown enhancement mode AlGaN/GaN HEMTs with integrated slant field-plate," Electron Devices Meeting, 2006, IEDM '06 International, 3 pages.
Sugiura et al., "Enhancement-mode $n$-channel GaN MOSFETs fabricated on $p$-GaN using $HfO_2$ as gate oxide," Aug. 16, 2007, Electronics Letters, vol. 43, No. 17, 2 pp.
Tipirneni et al., "Silicon dioxide-encapsulated high-voltage AlGaN/GaN HFETs for power-switching applications," IEEE Electron Device Letters, 28(9):784-786, 2007.
Vetury et al., "Direct measurement of gate depletion in high breakdown (405V) Al/GaN/GaN heterostructure field effect transistors," Electron Device Meeting, 1998 (IEDM 98), Technical Digest, pp. 55-58.
Wang et al., "Comparison of the effect of gate dielectric layer on 2DEG carrier concentration in strained AlGaN/GaN heterostructure," 2005, Mater. Res. Soc. Symp. Proc., vol. 831, 6 pp.
Wang et al, "Enhancement-Mode $Si_3N_4$/AlGaN/GaN MISHFETs," IEEE Electron Device Letters, 2006, 27(10):793-795.
Wu, Y., et al., "A 97.8% efficient GaN HEMT boost converter with 300-W output power at 1 MHz," IEEE Electron Device Letters, 29(8):824-826, 2008.
Wu, Y., "AlGaN/GaN microwave power high-mobility-transistors," Diss., University of California, Santa Barbara, 1997.
Yoshida, S., "AlGan/GaN power FET," Furukawa Review, 21:7-11, 2002.
Zhang, N., "High voltage GaN HEMTs with low on-resistance for switching applications," Diss., University of California, Santa Barbara, 2002.
Authorized officer Simin Baharlou, International Preliminary Report on Patentability in PCT/US2008/076160, mailed Mar. 25, 2010, 6 pages.
Authorized officer Beate Giffo-Schmitt, International Preliminary Report on Patentability in PCT/US2010/021824, mailed Aug. 18, 2011, 7 pages.
SIPO First Office Action for Application No. 200980114639.X, May 14, 2012, 13 pages.
Search Report and Action in TW Application No. 098132132, issued Dec. 6, 2012, 8 pages.
European Search Report in Application No. 10 81 5813.0, mailed Mar. 12, 2013, 9 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Hye Lyun Park, International Search Report and Written Opinion in PCT/US2013/050914, mailed Oct. 18, 2013, 11 pages.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

* cited by examiner

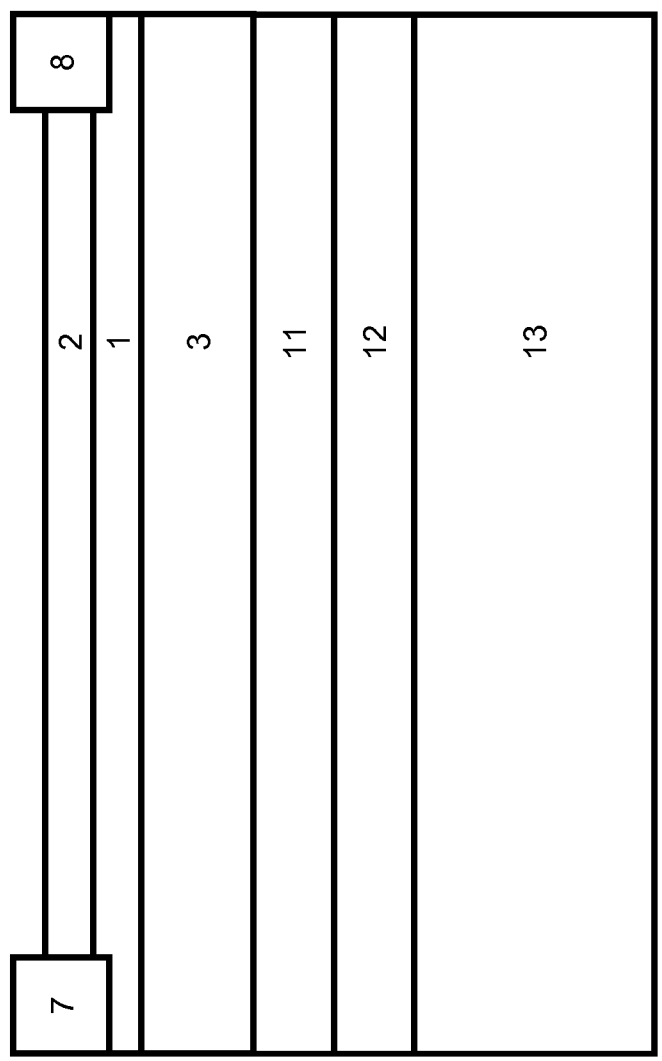

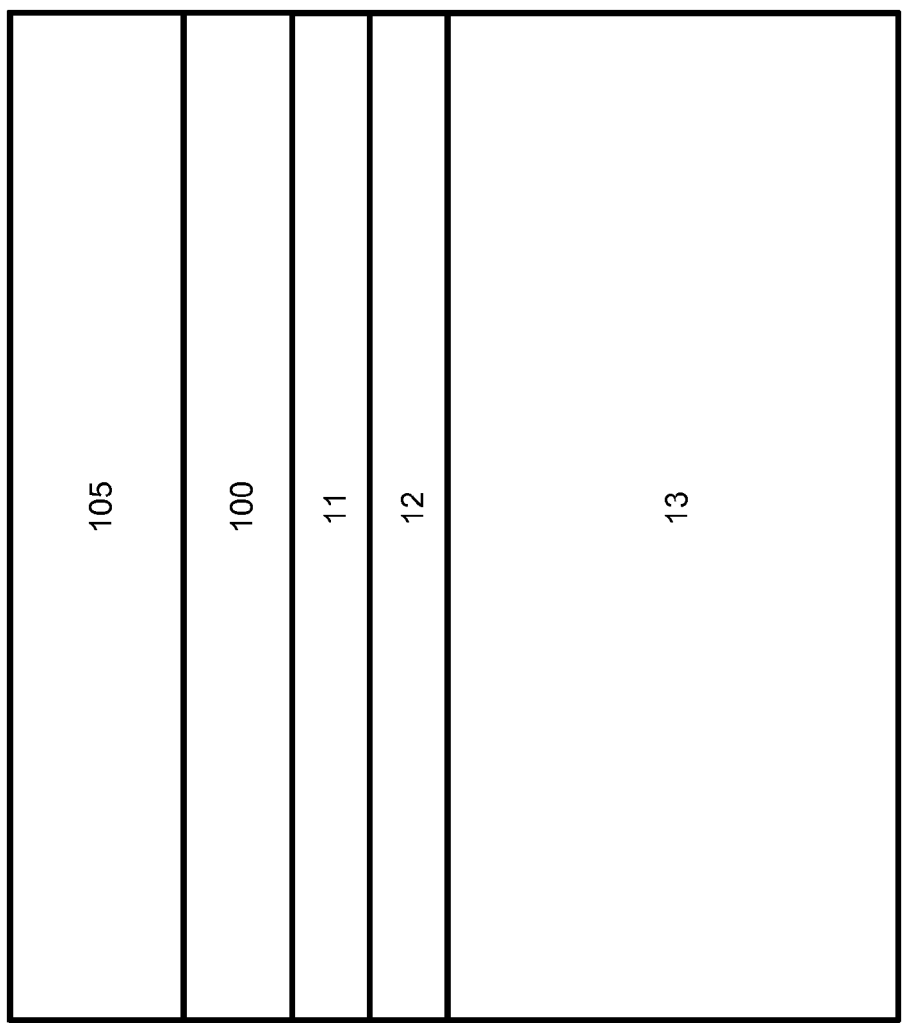

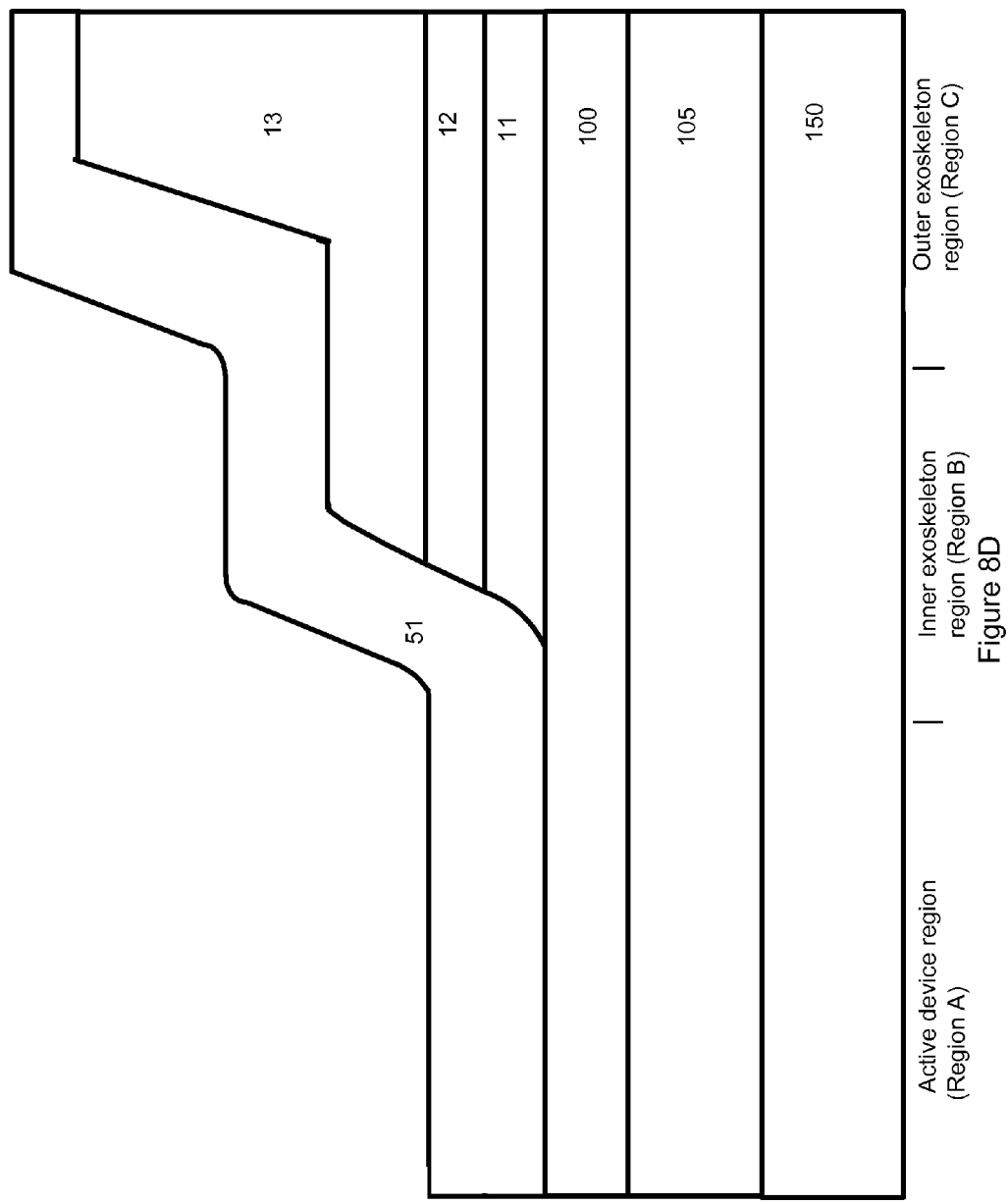

METHODS OF FORMING REVERSE SIDE ENGINEERED III-NITRIDE DEVICES

CROSS-REFERENCE TO RELATED APPLICATION

This is a divisional of U.S. Application Ser. No. 12/635,405, filed on Dec. 10, 2009 (now U.S. Pat. No. 8,389,977), the disclosure of which is considered part of and is incorporated by reference in the disclosure of this application.

TECHNICAL FIELD

This invention relates to semiconductor devices fabricated on group III-nitride semiconductors.

BACKGROUND

Group III-nitride based devices have many potential material advantages over silicon based devices for high power electronics applications. Amongst others, these include larger bandgap and breakdown field, high electron mobility in a two dimensional electron gas (2DEG), low thermal generation current, and the possibility of using the direct bandgap plus a great variety of band and polarization engineering techniques applicable in many of these structures for novel device functions. However, applications have been hampered by a lack of low cost substrates for device fabrication.

Devices are sometimes made by heteroepitaxy on suitable substrates such as silicon carbide, sapphire or silicon. Techniques for applying the layers can include molecular beam epitaxy (MBE) or metal organic chemical vapor deposition (MOCVD) and hydride vapor phase epitaxy (HVPE). High voltage devices of gallium nitride (GaN) can require thick GaN layers, such as 2-6 micron thick layers. It can be difficult to grow thick gallium nitride by heteroepitaxy. Various stress management techniques such as graded layers or superlattices and various compensation techniques such as iron (Fe) or carbon (C) doping are used to enable growth of thick layers and to enable high resistivity buffer layers.

While the total thickness of the GaN buffer layer can be important in some devices, it can also be important to achieve a sufficiently thick layer of material with low defect density. The concentrations of extended and point defects that give deep levels in the band gap as well as dopants have to be low. This can facilitate operation of the device at high voltage without the device being subject to trapping, leakage or early breakdown effects.

To accommodate a large voltage across the source/gate and the drain in a transistor, such as a heterojunction field effect transistor (HFET), or across the anode and the cathode in a diode, the spacing required between the electrodes to sustain the voltage typically has to be large—for example, a 1 kV device may need an electrode spacing of 10 microns or larger. Thus, high voltage lateral devices require large areas and need to be made on low cost substrates. Silicon substrates are typically the most cost effective substrates for formation of III-N type devices. However, due to the large lattice and thermal mismatch between silicon and gallium nitride, nucleation and stress management layers may be required. These layers, such as superlattice layers of $Al_xGa_{1-x}N$ can have a high density of dislocations and other deep trapping centers. While this approach can produce acceptable spacer, channel and barrier layers, a high quality thick buffer layer is difficult to achieve. Because the layers below the spacer layer can have a high concentration of defect levels in the bandgap, this can cause drain voltage induced current collapse and leakage at high drain biases and can also reduce breakdown voltage of the device.

SUMMARY

In one aspect, a group III-nitride device is described that includes a stack of III-nitride layers, a first passivation layer, a second passivation layer and one or more conductive contacts. The stack includes a channel layer, a barrier layer directly adjacent to the channel layer and a spacer layer directly adjacent to a side of the channel layer opposite to the barrier layer. The channel layer includes a 2DEG channel in the channel layer adjacent to the barrier layer. The first passivation layer directly contacts a surface of the spacer layer on a side opposite to the channel layer, wherein the first passivation layer is an electrical insulator and the stack of III-nitride layers and the first passivation layer form a structure with a reverse side proximate to the first passivation layer and an obverse side proximate to the barrier layer. The second passivation layer is on the obverse side of the structure. The contacts are electrically connected to the 2DEG channel.

In another aspect a method for forming a device is described. A nucleation layer is formed on a mother substrate, wherein the nucleation layer includes AlN. A stress management layer is formed on the nucleation layer that is on the mother substrate, wherein the stress management layer includes a III-nitride material. A stack of III-nitride layers is formed on the stress management layer, wherein forming the stack includes forming a channel layer with a 2DEG channel therein, the stacking having an obverse face opposite to the stress management layer. The obverse face of the stack is attached to a carrier wafer. An entirety of the mother substrate, the nucleation layer and the stress management layer is removed, wherein the removing step exposes a reverse surface of the stack. The reverse surface is passivated with a dielectric layer.

In yet another aspect a method for forming a device is described. A nucleation layer is formed on a mother substrate, wherein the nucleation layer includes AlN. A stress management layer is formed on the nucleation layer that is on the mother substrate, wherein the stress management layer includes a III-nitride material. A stack of III-nitride layers is formed on the stress management layer, wherein forming the stack includes forming a channel layer with a 2DEG channel therein. At least a portion of the mother substrate, a portion of the nucleation layer and a portion of the stress management layer is removed, wherein the removing step only removes a portion of the mother substrate and forms a thin exoskeleton portion and a thick exoskeleton portion, wherein the mother substrate is thinner in the thin exoskeleton portion than in the thick exoskeleton portion.

Implementations of the devices and methods described herein may include one or more of the following features. The first passivation layer and the second passivation layer can each have a sufficiently large bandgap, sufficiently low bulk defect density and sufficiently low interface density so that breakdown of the device is improved in comparison with a device having the stack of III-nitride layers and lacking the first passivation layer and the second passivation layer. The first passivation layer can have an active interface state density of less than $10^{12}/cm^2$ and an active bulk trap density less than $10^{20}/cm^3$. The first passivation layer or the second passivation layer can be formed of an inorganic dielectric material. The first passivation layer or the second passivation layer can include silicon nitride, silicon dioxide, silicon oxynitride, alumina or aluminum nitride. The first passivation layer or the second passivation layer can be an organic dielectric material. The first passivation layer or the second passivation layer can include an organic resin. The organic resin can include one of polyimide, benzocyclobutene (BCB) or SU8. The passivation layer can include a stack of at least one organic dielectric material and at least one inorganic dielectric material. The conductive contact can be electrically connected to the reverse side of the structure. The stack of III-nitride layers can be between 0.5 and 30 microns thick. The device can include a gate contact and a gate dielectric, wherein the gate dielectric is between the stack of III-nitride layers and the second passivation layer. One of the one or more conductive contacts can be a gate contact on the obverse side of the structure; one of the conductive contacts can be a source contact on the obverse side of the structure; one of the conductive contacts can be a drain contact on the reverse side of the structure; and the second passivation layer can cover an entirety of the obverse side of the structure including a space between the gate contact and the source contact. The device can include a nucleation and stress management layer contacting the spacer layer; and a mother substrate that includes silicon, wherein the nucleation and stress management layer is between the stack of III-nitride layers and the mother substrate; wherein the device has a first portion including the stack of III-nitride layers and a second portion including the stack of III-nitride layers, the nucleation and stress management layer, and the mother substrate, the second portion forming an exoskeleton and the first portion can be free of the mother substrate and the nucleation and stress management layer. The device can include a dielectric layer on a side of the mother substrate that is opposite to the stack of III-nitride layers. The device can include a conductive layer, wherein the dielectric layer is between a metallization layer and the mother substrate. The exoskeleton can have a thin portion and a thick portion, wherein the mother substrate in the thin portion is thinner than the mother substrate in the thick portion and the conductive layer does not extend into the thick portion of the exoskeleton. The mother substrate in the thin portion can be between about 10 and 50 microns. A conductive layer can be on the obverse side that is connected to a conductive pad in the second portion. The exoskeleton can maintain sufficient strain in the stack of III-nitride layers to create a 2DEG in the channel layer. The second passivation layer can be confined to the first portion. At least one of a control, protection, synchronization or drive circuit on the exoskeleton can be in either the silicon or III-nitride active region. Forming the device can include forming conductive contacts that are in electrical contact with the 2DEG channel. The stack of III-nitride layers can include a barrier layer on a first side of the channel layer and a spacer layer on a second side of the channel layer; the spacer layer can include an etch stop layer; and the removing step can etch to the etch stop layer. The method can include forming an external contact to the 2DEG channel, wherein the external contacts extends through the dielectric layer. The method can include fabricating one of a diode or a transistor in the stack of III-nitride layers. The stack of III-nitride layers can include a barrier layer on a first side of the channel layer and a spacer layer on a second side of the channel layer; the spacer layer can include an etch stop layer and the removing step can etch to the etch stop layer.

The object of forming a high voltage lateral group III nitride device may be achieved using one or more of the following techniques. An appropriate semiconductor stack can be fabricated by heteroepitaxy on a low cost substrate, which is subsequently removed after the obverse face of the epitaxial film is attached on a carrier wafer that also has appropriate metallization and vias. Substrate material can be thinned, which can include thinning of the epitaxial material. Defected nucleation and stress management layers that form the buffer layer can be removed. The reverse surface can be treated to remove near surface defects and covered with a passivation layer. Appropriate vias and metallization can make device terminals from the obverse face accessible on the reverse.

Some of the devices described herein are fabricated using the layout and process best suited for a particular function in a hetero-epitaxial layer grown on a wafer/substrate, the wafer/substrate on which a device is formed is then mounted on another appropriate wafer and the initial wafer/substrate and the nucleation and stress management layers grown during hetero-epitaxy are removed; the reverse face is then passivated and contact vias opened for metallization to the upper electrodes. Depending on packaging requirements one chooses to have the final substrate on either the obverse or reverse face with the appropriate structures and processes to make contact with the device metallization pads.

BRIEF DESCRIPTION OF DRAWINGS

FIGS. 2(a) to 2(m) depict schematic cross-sections of the device at various stages of processing.

FIGS. 8(a) to (f) show schematics of the cross-sections of an implementation with an exoskeleton at various stages of processing.

Like reference symbols in the various drawings indicate like elements.

DETAILED DESCRIPTION

Figure 1:
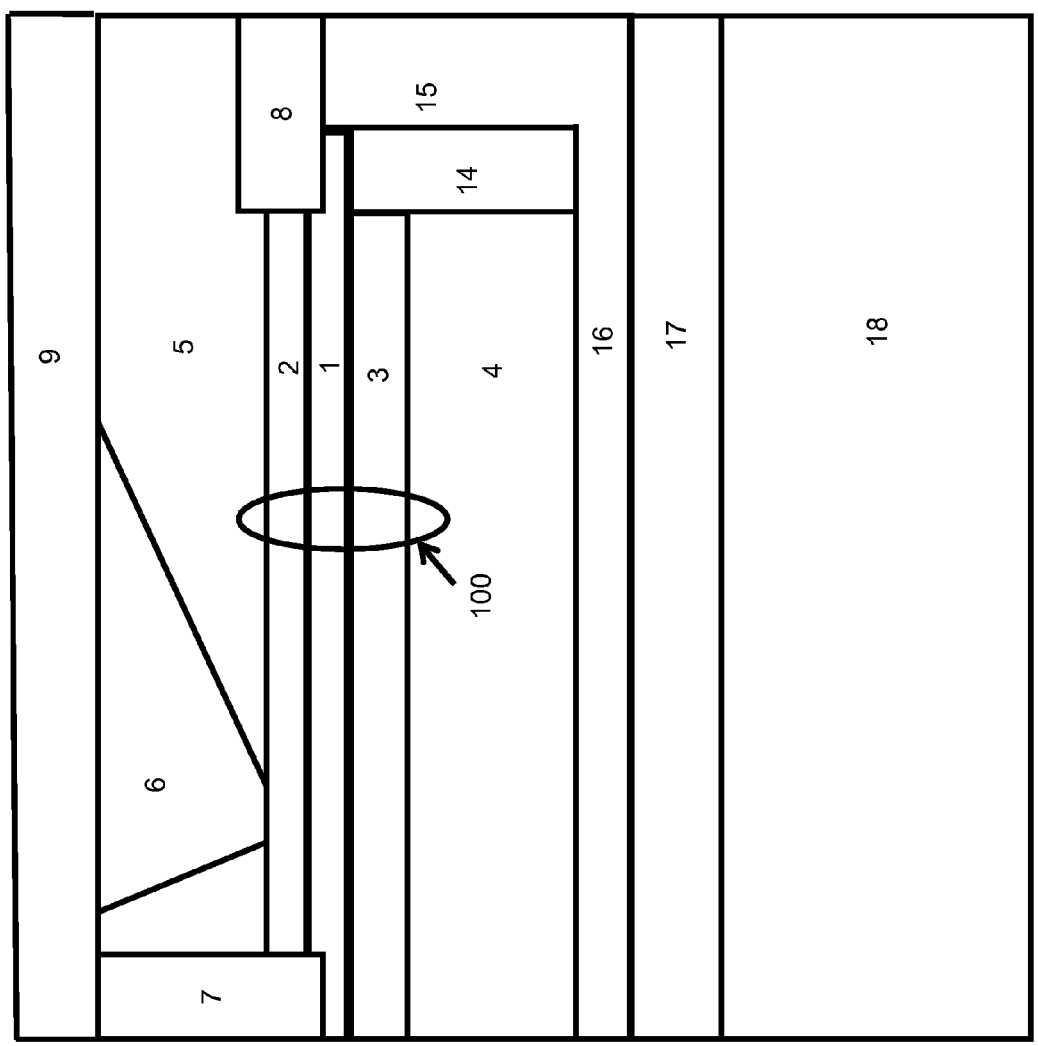
FIG. 1 shows a schematic of a cross-section of a half cell of an HFET.

Described herein are techniques that enable III-nitride type devices to be formed using silicon base substrates.

As used herein the obverse or device face is the face of the wafer or epitaxial layer on which a lateral device is fabricated by forming electrodes that make ohmic and/or Schottky and/or metal-insulator-semiconductor (MIS) contacts to the semiconductor. The reverse face is opposite to the obverse or device face. As used herein, the term "III-nitride material" or "III-N material" refers to a compound semiconductor material according to the stoichiometric formula $Al_xIn_yGa_zN$, where $x+y+z$ is equal to 1 or about 1. The devices described herein are group III face devices. However, the techniques described herein can be applied to N-face devices with the appropriate change in the relative location of the 2DEG layer and layer type (i.e., whether the layer is p- or n-type or intrinsic). As used herein, "active layer(s)" are a set of III-nitride layers in which devices are made, wherein changes of at least one potential barrier in the active layer due to voltages applied at terminals cause currents to flow through at least a pair of terminals in a desired fashion; and "active regions" are areal regions comprising of one or more cells of a semiconductor device. A cell of a power transistor, for example, as referred to herein includes a source, gate and drain, and the cell of a diode includes an anode and a cathode and the access region in between. Additionally, devices described herein are n-channel devices, but the general concepts can apply to p-channel devices as well.

Some power devices formed with III-nitride layers on a silicon substrate utilize nucleation and stress management layers to enable proper formation of the III-nitride layers. Removal of the nucleation and stress management layers, which have high defect concentrations, is desirable to enable high voltage power devices to meet acceptable switching performance. To remove the defected layers one needs to access them by removing the mother substrate and then removing the defected epitaxial layers on the reverse face of the group-III nitride layers. To do this, the obverse face is mounted on an appropriate carrier wafer. The substrate on which the growth was initially made, i.e., the mother substrate, is removed and then the defected layers are removed. After removal of the mother substrate and one or more defected layers, a suitable passivation layer is applied. The passivation layer ensures high voltage operation without the negative impact of trapping. Also, a thin active layer by itself is not capable of supporting high voltage operation and without the passivation layers on both faces, the exposed surface of the thin active layer is susceptible to trapping effects and the high surface fields may also cause dielectric breakdown of air. Appropriately patterned metallizations create the necessary contacts for the device. As used herein, two or more contacts or other items are said to be "electrically connected" if they are connected by a material which is sufficiently conducting to ensure that the electric potential at each of the contacts or other items is about the same at all times.

Lift-off of a III-nitride epitaxial film and removal of the nucleation layer can modify the strain in the film and affect the polarization charge. Management of strain and thence polarization charge are important considerations in the design of high voltage lateral devices. Another consideration is that removal of the mother substrate and the buffer layer can affect the strain in the active layer. Strain in the active layer might be modified when the mother substrate and/or the nucleation and stress management layers are removed. Strain in the active layer might also be modified during the process of depositing thick passivation layers or bonding or attaching the active layer to a handling or carrier substrate. Modification of strain in the active layer can mean modification of the polarization charge, which affects the electrical parameters of the device.

In some implementations, the amount of lattice strain in the active layer during growth is so high that strain relief happens by formation of dislocations and stacking faults or other defects that relax the lattice strain and stabilize the strain in the layer. In some other implementations, the strain management layer can effectively contain the lattice mismatch between the substrate and the epi-layer at the growth temperature or if the grown epi-layer is thin, there is little strain. Therefore strain relief in the upper layers by the formation of defects does not occur during growth. However, as the wafer is cooled down to room temperature, strain develops in the III-nitride epi-layers if there is mismatch of thermal coefficients of expansion of adjacent layers. The strain caused in the III-N layers by the mismatch of thermal coefficients of expansion is tensile if the substrate is silicon.

As long as there is adequate residual tensile strain in the active GaN layer, the polarization charge is adequate to form a 2DEG required for low on-resistance devices. In moderately defected layers in which lattice defects form to relax strain (threading dislocation density $>\sim 10^9/cm^2$), crystal strain does not change much when the epitaxial layer is lifted off from the substrate. However, high quality strained films with low defect density relax substantially to relieve strain after substrate removal and polarization charge and thence the 2DEG can get substantially reduced. For these cases, features can be incorporated in the device structure to prevent tensile strain and thence 2DEG collapse or a suitable amount of modulation doping can be added in the AlGaN barrier layer to maintain the desired 2DEG charge density. Ideally, no structure modification or process that creates stresses should affect the strain in the active layer deleteriously.

While discussing specific implementations in the following sections, cross-sections of half cells of devices are shown. A full cell is formed by juxtaposing a laterally inverted half-cell next to the half cell. A power device can include many full cells in parallel, the cells being connected by on-chip busses to bonding pads. In some cases access to source or drain contacts is shown through vias located in the half cell itself. While connecting the source and drain contacts through vias in the half cell is possible for many situations, in some cases it can be a better to have vias, especially vias through the III-nitride layers, at nearby busses or at via pads located away from the active regions of the device. This would be an engineering decision based on many factors such as device layout, current density, device size, etc, and this application includes those cases in which contacts are accessed at locations away from the active device.

In some implementations, a HFET is formed with gate and source contacts on an obverse face and a drain contact on the reverse face, as shown in FIG. 1. Layers 1, 2, and 3 are III-nitride semiconductors. Channel layer 1 is an unintentionally doped or p⁻ doped III-nitride layer in which the channel of the device is formed and a 2DEG sheet may lie. Barrier layer 2 has a bandgap larger than that of the channel layer 1. Optionally, there is a cap layer on top of barrier layer 2 of a smaller bandgap material (a barrier layer 2' that is not shown) that is unintentionally or p⁻ doped. Spacer layer 3 has a bandgap not smaller than that of the channel layer 1 and can be a multilayer structure. The spacer layer 3 separates the channel layer 1 from the reverse face passivation layer. When layers 1 to 3 are high quality layers, carrier trapping or scattering in these layers, which affects device current, is reduced. Defects in these layers also affect leakage current and breakdown voltage.

A stack of III-nitride semiconductor material layers 100 can include a channel layer 1, a spacer layer 3 and a barrier layer 2, with the channel layer 1 between the spacer layer 3 and the barrier layer 2. The channel layer 1, barrier layer 2 and spacer layer 3 are each formed of III-N materials. The bandgap of the barrier 2 is greater than the bandgap of the channel layer 1, which enables a 2DEG to form in the channel layer 1 near the interface of layers 1 and 2. In some implementations, a cap layer (not shown) is on an opposite side of the barrier layer 2 from the channel layer 1 and has a smaller bandgap than the barrier layer 2 and can either be unintentionally doped or p-doped. The bandgap of the spacer layer 3 is at least as great as the bandgap of channel layer 1. In some implementations, the spacer layer 3 is formed of multiple layers of material that have different composition from one another.

A reverse side passivation layer 4 of dielectric material such as silicon nitride, aluminum nitride, silicon oxide, alumina or various combinations of any of these or other suitable dielectrics, which may be a combination of inorganic or organic dielectrics, for example, polyimide, benzocyclobutene (BCB) or SU8 or a combination of two or more of these, is on the opposite side of the spacer layer 3 from the channel layer 1. A device side passivation layer 5 of dielectric materials, such as inorganic dielectrics, for example, silicon nitride, aluminum nitride, alumina or silicon oxide, or organic dielectrics, for example, polyimide, benzocyclobutene (BCB) or SU8 or a combination of two or more of these, can be on the opposite side of the stack of III-nitride semiconductor material layers 100 from the reverse side passivation layer 4. The passivation layers can be formed from dielectrics that have a large conduction band offset with respect to III-nitrides, create fewer surface states on the III-nitride cap layers and have low trap density so that there is no trap assisted tunneling or hot carrier trapping in the dielectric.

Gate 6, with an integral sloping field plate, is formed from an electrically conducting layer such as metal or a degenerately doped semiconductor covered with a metal that forms an ohmic contact with the degenerately doped semiconductor. For an insulated gate HFET, an appropriate dielectric (not shown) might lie between the gate 6 and the barrier layer 2.

Source 7 can be formed from a metal or a highly doped n-type semiconductor and a metal layer that makes an ohmic contact to the highly doped n-type semiconductor. The source 7 injects electrons to the channel layer 1. Drain 8 is a metal or a highly doped n-type semiconductor and a metal layer making an ohmic contact to the highly doped n-type semiconductor.

A metal plug 15 connects the drain 8 to reverse side drain contact 16 that is adjacent to the reverse side passivation layer 4. The reverse side drain contact 16 enables the drain 8 to be connected to the reverse side of the device. A passivating insulator 14 on the sidewall of a via that is subsequently filled with conductive material, here the via leading to the drain 8, passivates and insulates the stack of III-nitride semiconductor material layers 100 from the metal plug 15, that is, the plug that is formed by filling the via. A thermally and electrically conductive layer 17 is on a side of the reverse side drain contact 16 opposite to the reverse side passivation layer 4. The thermally and electrically conductive layer 17 is between the reverse side drain contact 16 and a thermally and electrically conducting substrate 18.

Various stages of one implementation of processing for a HFET (the half cell cross-section of which is shown in FIG. 1) are shown schematically in FIGS. 2(a-m). Referring to FIG. 2a, on a substrate 13, such as a substrate formed of <111> silicon or other suitable material, such as c-plane sapphire or SiC cation-face III-nitride layers are grown by an appropriate heteroepitaxial process. The substrate 13 is sometimes referred to herein as the mother wafer or mother substrate. The substrate 13 is eventually removed, leaving the stack of III-nitride semiconductor material layers 100 with little strain relaxation. The cation-face III-nitride layers include, in the following order from the substrate 13, a nucleation layer 12, which can be $AlN/Al_xGa_{1-x}N$, a stress management stack 11, which can be a AlN/GaN or a $Al_xGa_{1-x}N$/GaN superlattice, the spacer layer 3, which can be GaN or $Al_xGa_{1-x}N$ with x less than 0.1, the channel layer 1, which can be GaN, and the barrier layer 2, which can be $Al_xGa_{1-x}N$ with x more than 0.15.

Referring to FIG. 2b, after implantation or etch for device isolation, a source 7 and drain 8 are formed from ohmic contacts that are deposited on the stack of III-nitride semiconductor material layers 100 and annealed.

Figure 2A:
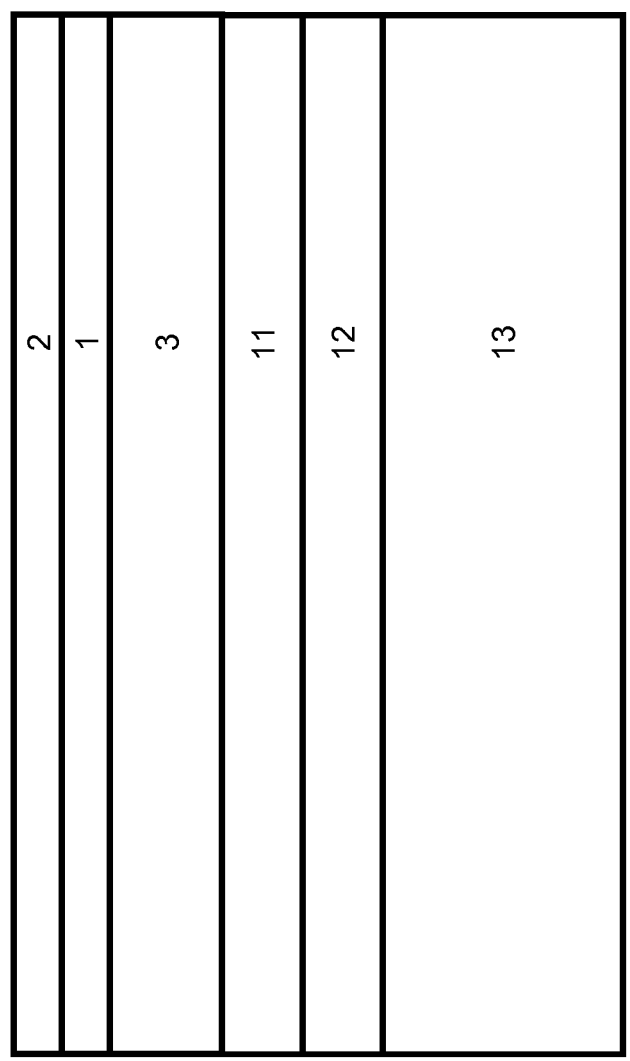
Figure 2C:
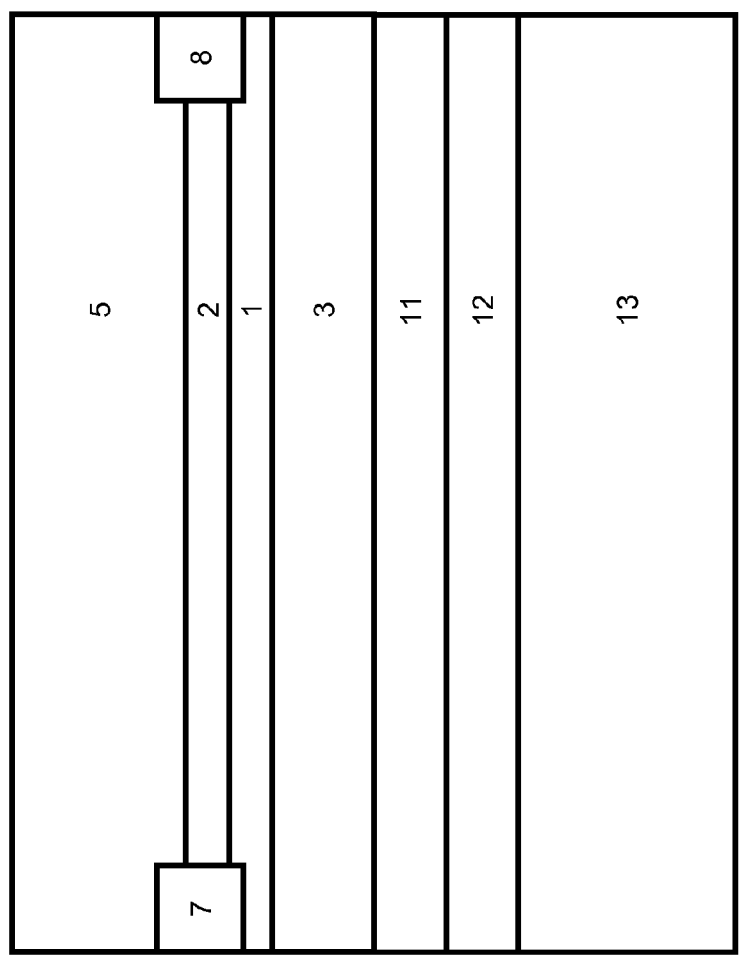

Referring to FIG. 2c, the exposed obverse surface of barrier layer 2 is passivated by depositing an insulator material, such as silicon nitride, aluminum nitride, silicon oxide a polymeric dielectric or some combination thereof to form the device side passivation layer 5. The device side passivation layer 5 can be deposited using a suitable dielectric deposition scheme, such as CVD, PECVD, atomic layer deposition (ALD), sputtering, or spin on, as shown in FIG. 2c.

Figure 2D:
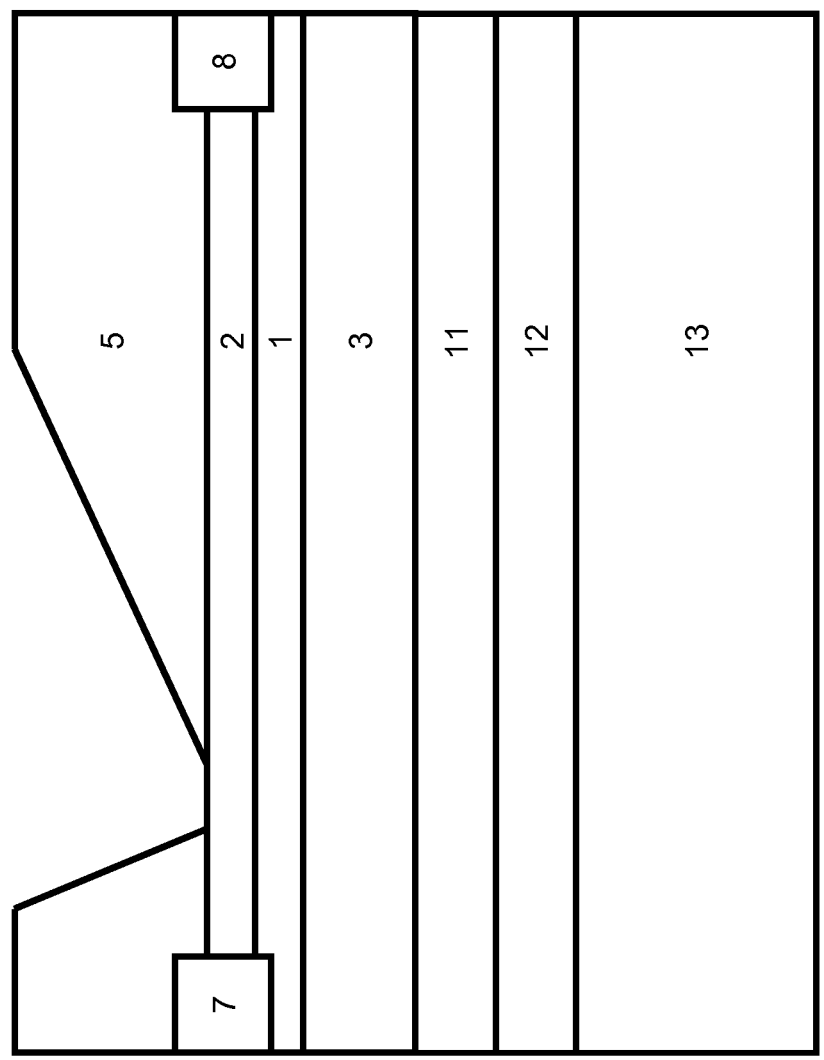

A gate trench is formed with field-reducing sloped sidewalls by recess-etching the device side passivation layer 5, as shown in FIG. 2d.

Figure 2E:
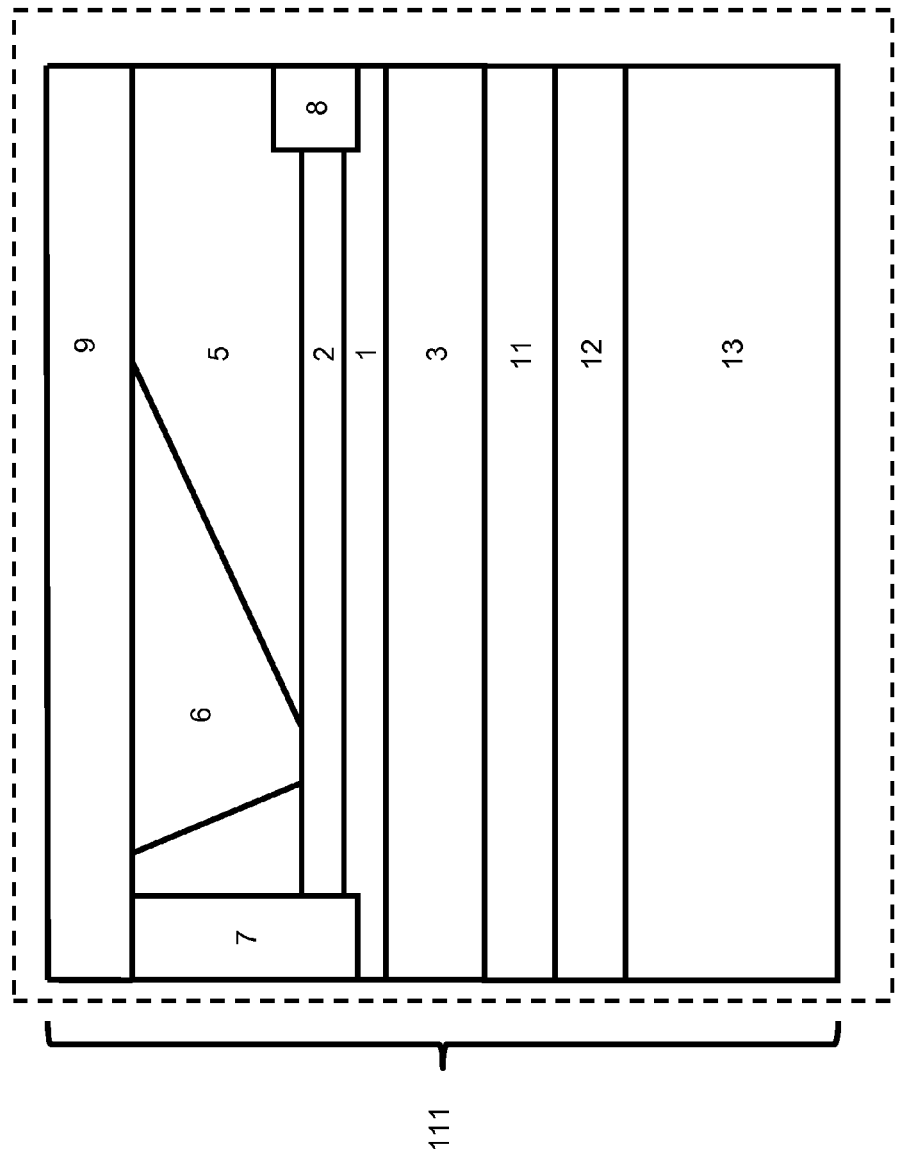

As shown in FIG. 2e, a via is made that extends to the source 7. The via and gate trench are filled with metal. Filling the gate trench forms the gate 6 and filling the via extends the source 7. Subsequently, the exposed surfaces of the gate 6 and the source 7 are passivated with a protective layer 9 that can be selectively removed for bonding wires to the source and gate bond pads. Forming the passivation layer 9 completes the fabrication steps on the obverse of the structure 111.

Figure 2F:
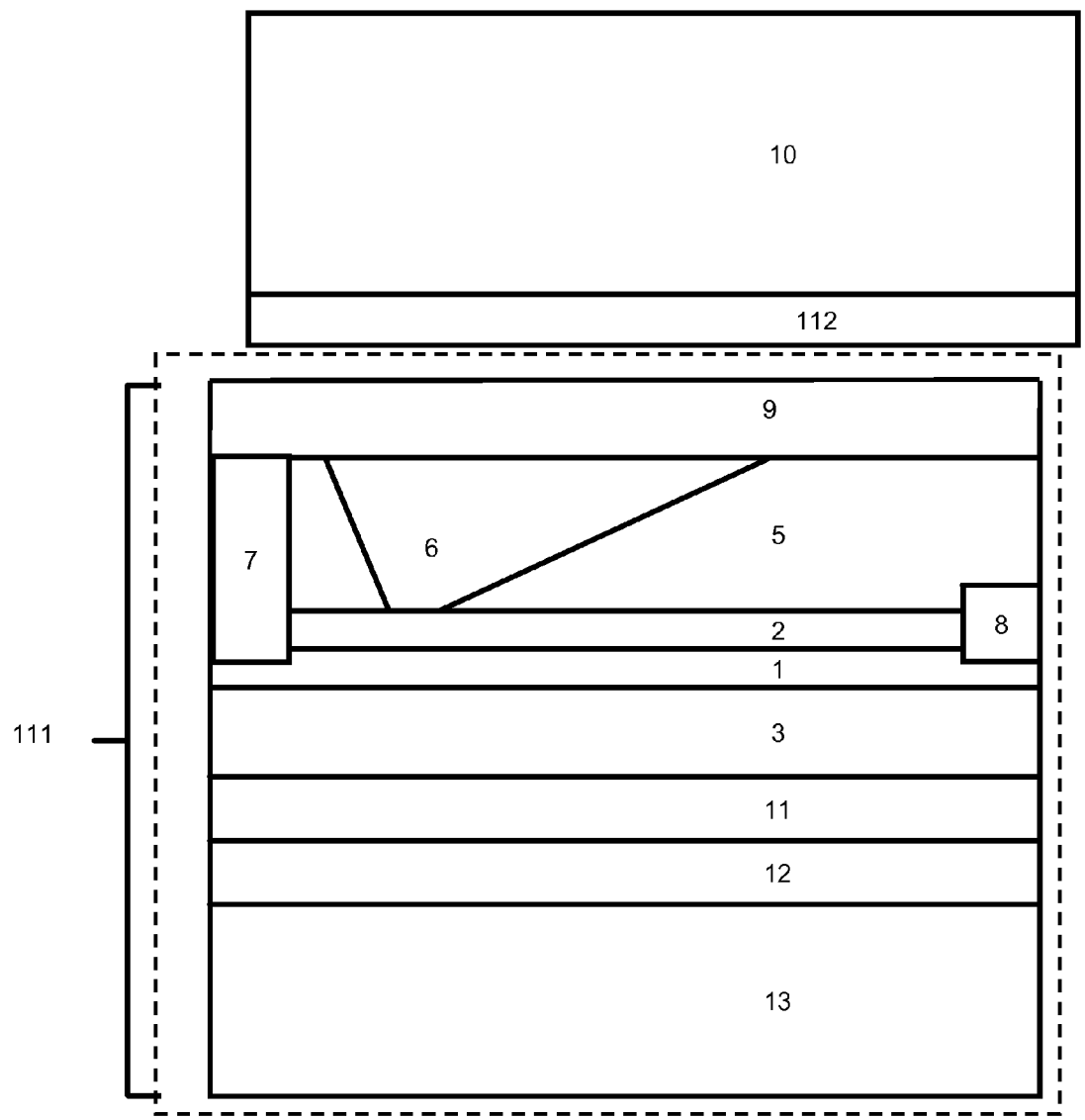
Figure 2G:
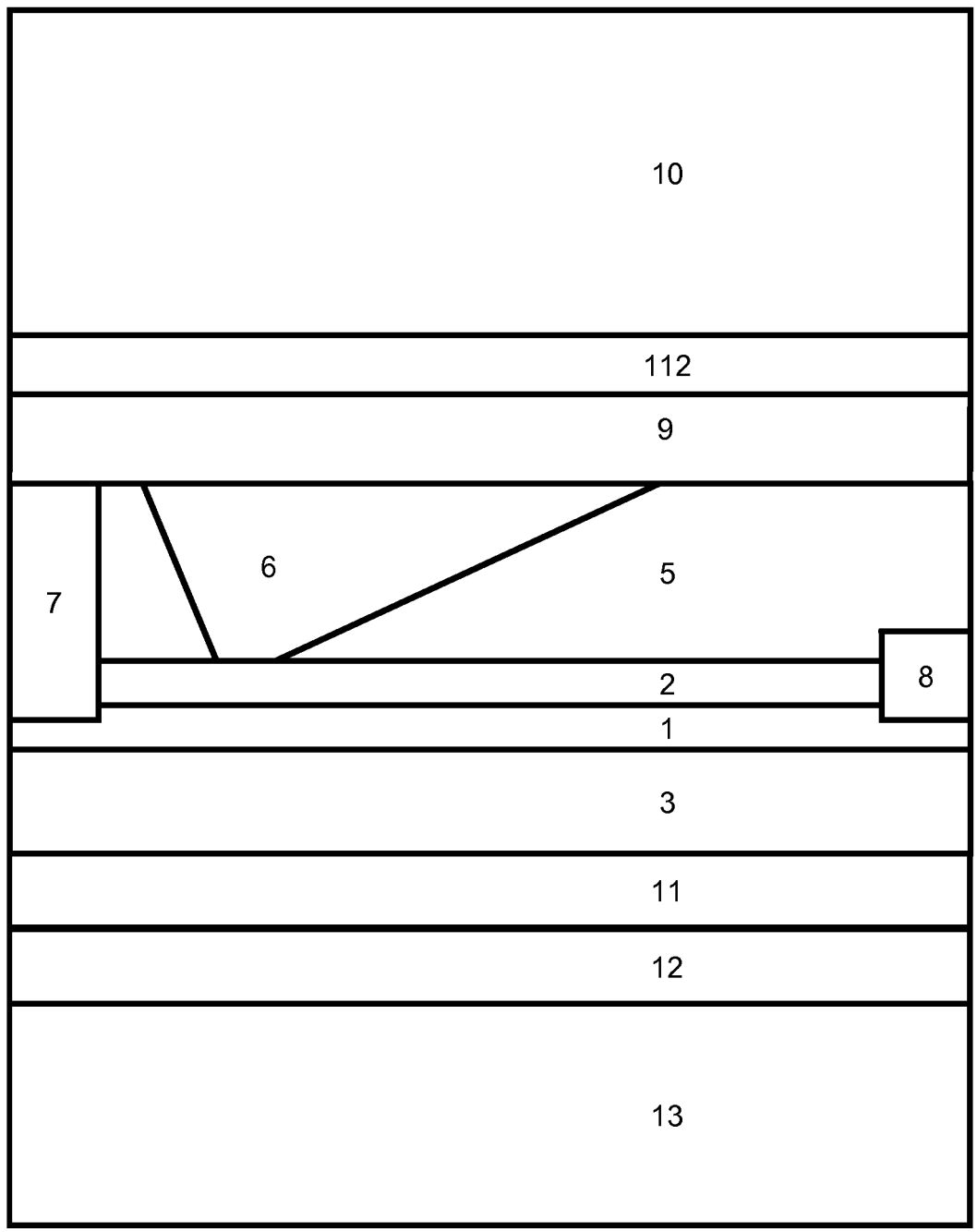

Referring to FIGS. 2f and 2g, the obverse face of the structure 111 is attached to a handling wafer 10. The handling wafer 10 can be adhered to the structure 111 using an adhesive 112 that is easily removable, such as a polymer adhesive system that loses its adhesive quality when exposed to solvent, heat or radiation, such as UV light. In some implementations, instead of attaching the structure 111 to a handling wafer 10, the obverse face is attached to battery powered mobile electrostatic wafer chuck.

Figure 2H:
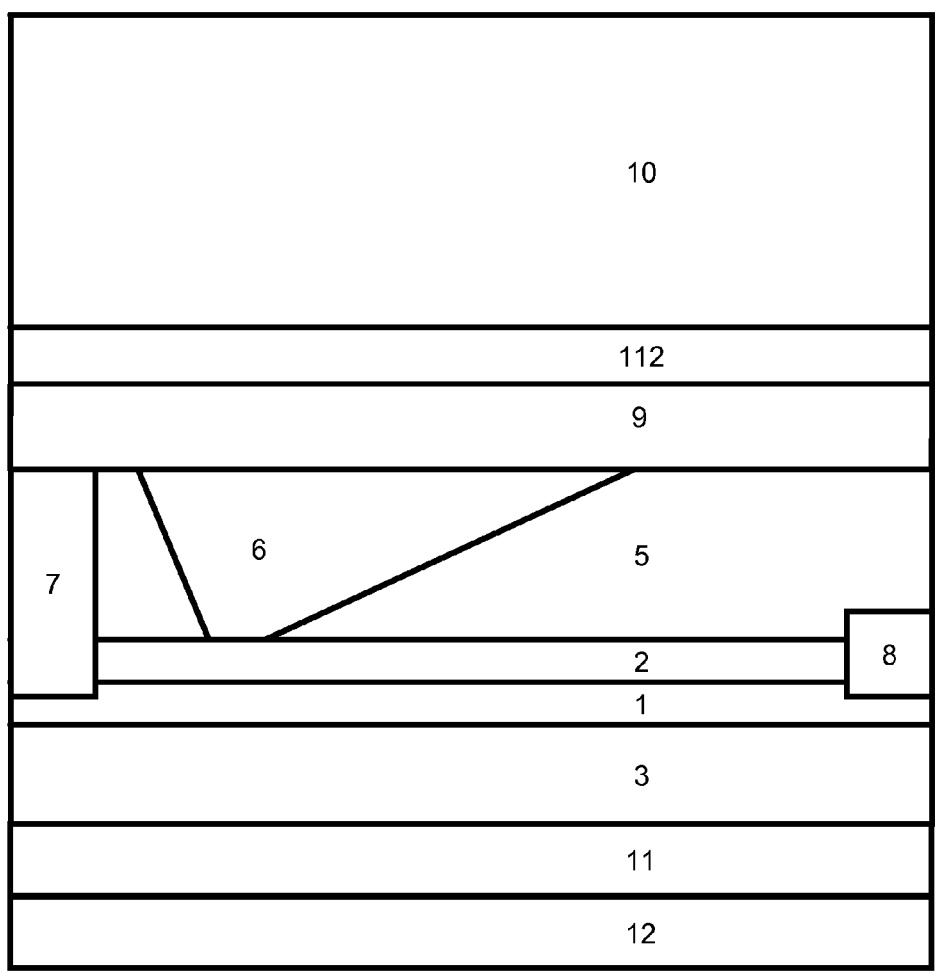

Referring to FIG. 2h, the mother substrate 13 on which the III-nitride layer was grown is removed. In some implementations the substrate 13 is thinned down to below 100 micrometers by lapping or a fast coarse etch. The remaining portion of the substrate 13 after thinning can be removed by wet etching or fluoride-based plasma etching followed by wet etching to the III-nitride nucleation layer 12. If the substrate 13 is formed of sapphire, the III-nitride layer can be lifted-off using near UV laser radiation or, if an appropriate interfacial layer is between the substrate 13 and nucleation layer 12, which can be removed by chemical liftoff. In some implementations the process used to achieve lift-off is selected to create little change of strain over the active area of the device.

Figure 2I:
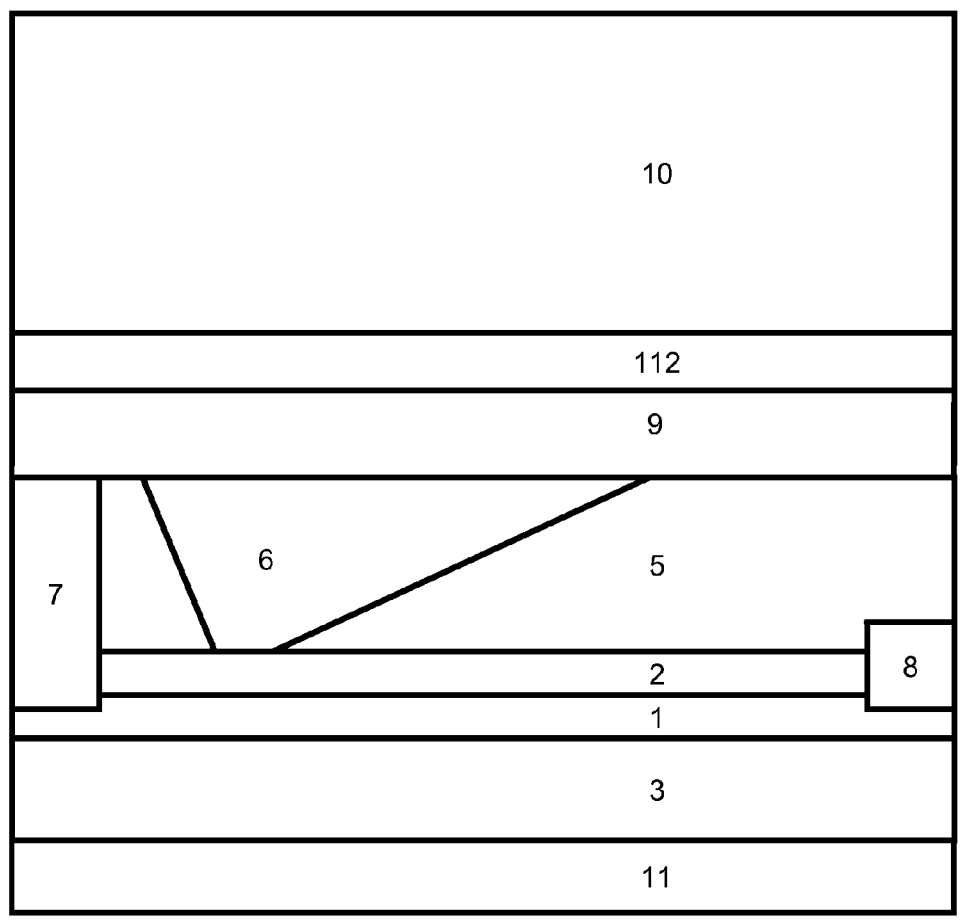
Figure 2J:
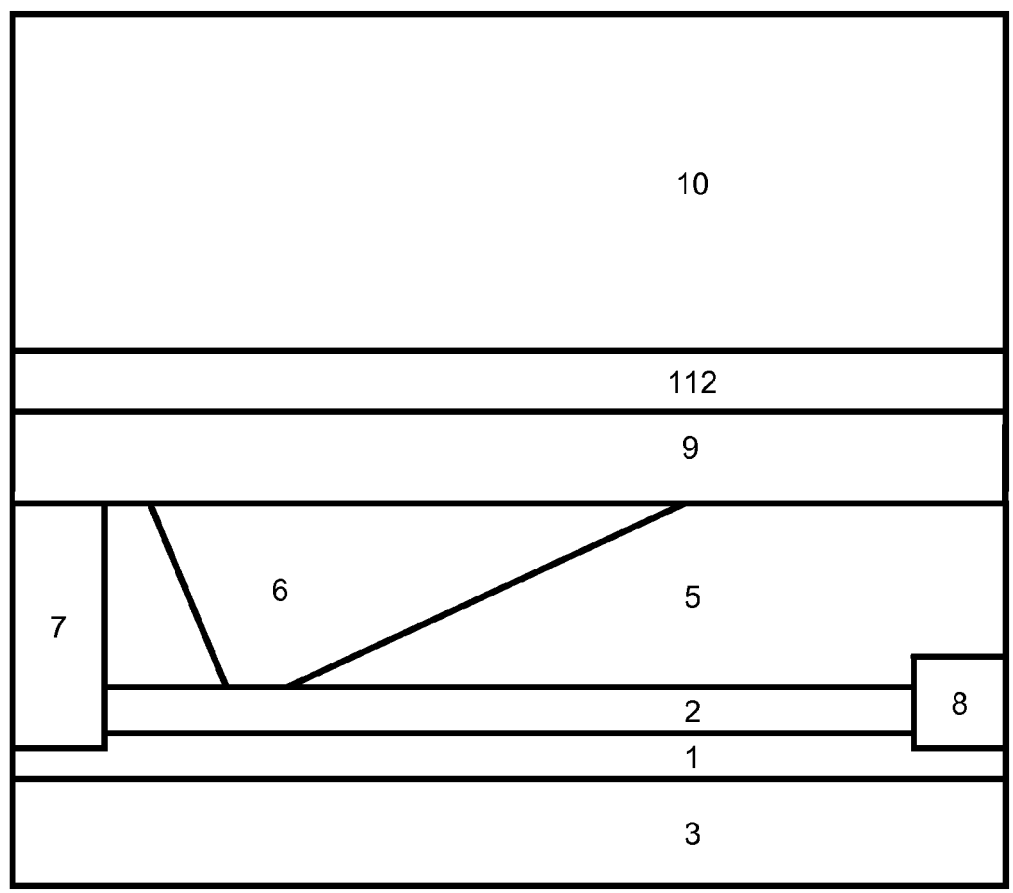

Referring to FIG. 2i, the nucleation layer 12 is removed, such as by etching in a chlorine-based plasma or by wet etching, if need be using electrochemical wet etching. Removing the nucleation layer 12 is followed by etching away the stress management layer 11, as shown in FIG. 2j, such as by using a process that does not introduce point defects in the spacer layer 3.

Figure 2K:
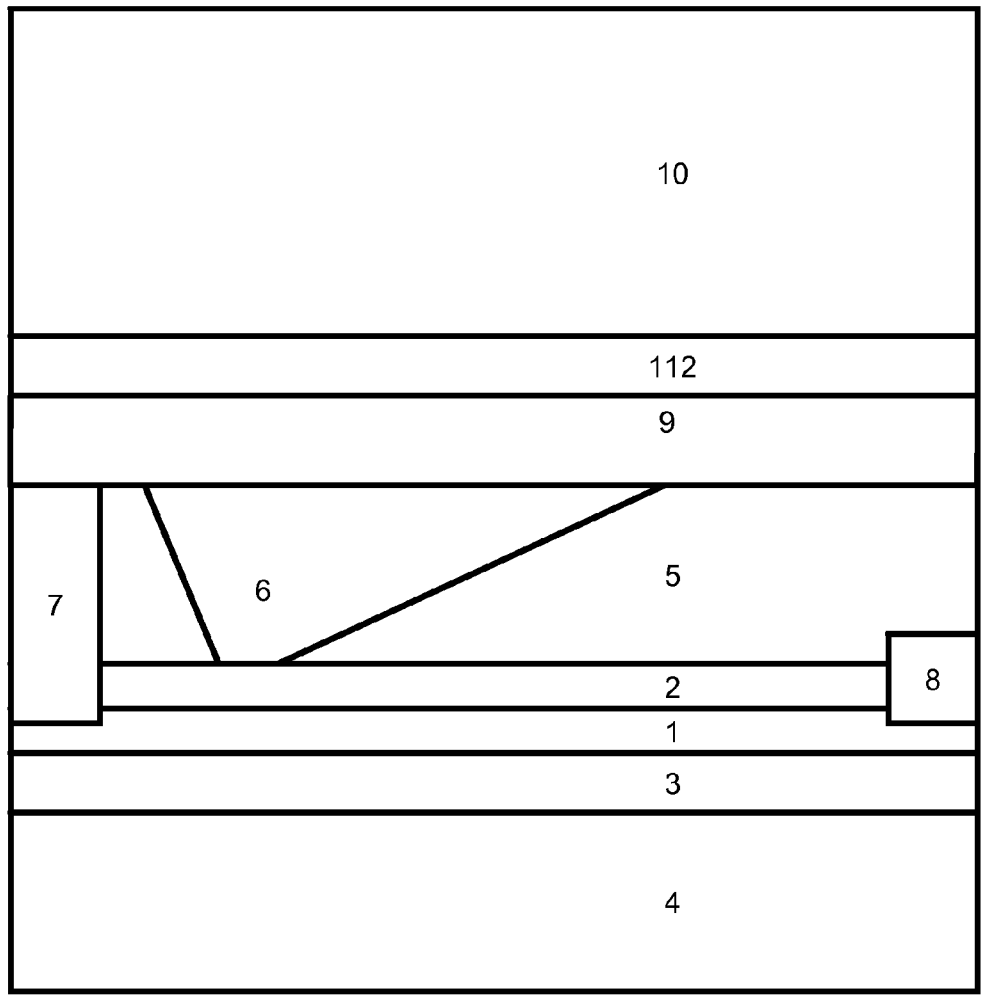

Once the mother substrate 13, nucleation layer 12 and stress management layer 11 are removed, a reverse side passivation layer 4 is deposited on the exposed reverse face of the spacer layer 3, as shown in FIG. 2k. The reverse side passivation layer 4 can be a rather thick layer so that the layer can withstand the maximum drain-source voltage the device is expected to withstand. For example, for a 1000V device the reverse passivation layer should be at least 5 microns thick low leakage dielectric comprised of one or more inorganic or organic dielectric mentioned earlier such that the reverse side passivation layer 4 is a good electrical insulator for III-nitride semiconductors. In some implementations, the reverse side passivation layer has interface state density of less than $10^{12}/cm^2$, such as less than $10^{10}/cm^2$ and a bulk trap density less than $10^{20}/cm^3$, such as less than $10^{18}/cm^3$. The bulk trap density can indicate traps in the passivation layer that make a device more leaky or give their characteristics hysteresis.

Figure 2L:
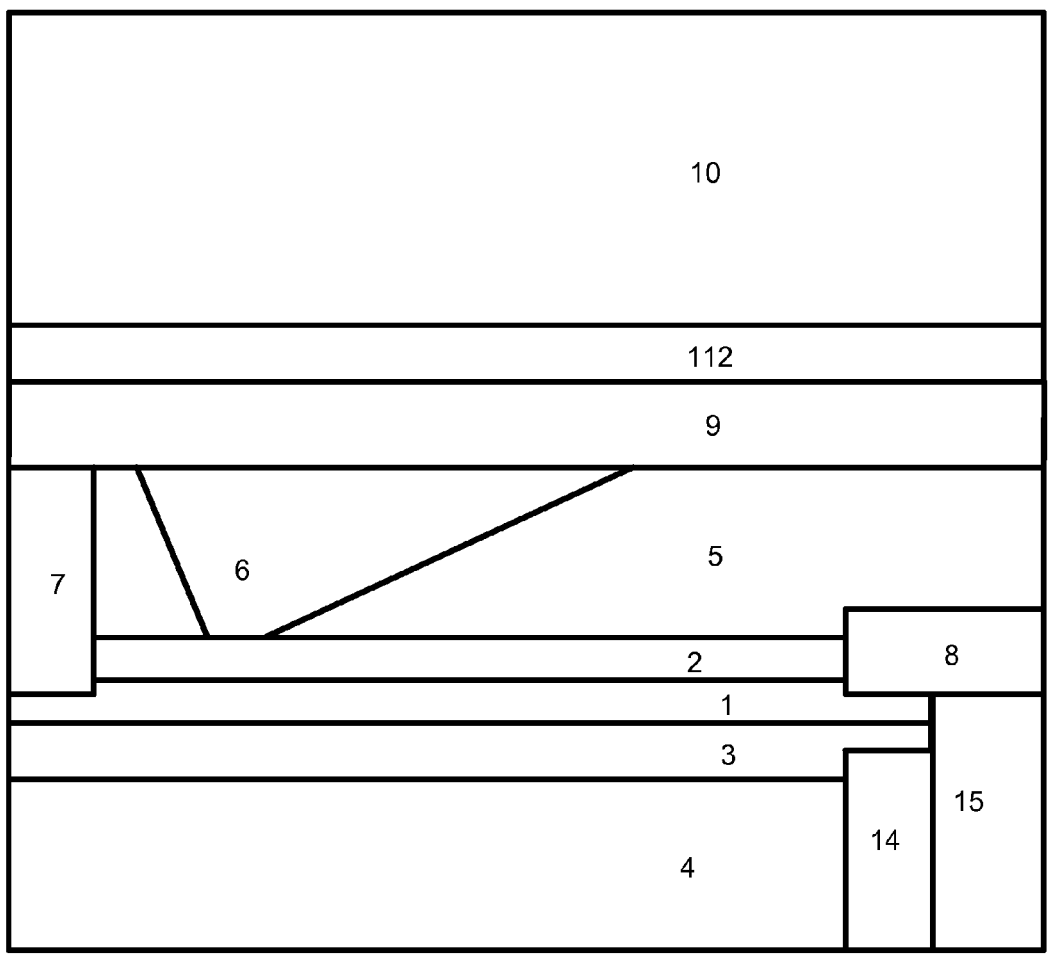

Referring to FIG. 2l, a via is formed through the reverse side passivation layer 4, the spacer layer 3, and the channel layer 1 to reach the drain 8. The via side walls are passivated by forming a passivating insulator 14 and the via is filled with a conducting metal plug 15 that makes good electrical contact to the drain contact metallization 8 on the obverse face of the device. While the via is shown to be in the active region of the device (and it might have to be located there for an enclosed drain cell configuration), it need not be so. The via could be located at a via/contact pad away from the active regions of the device, because that may reduce reverse leakage and increase breakdown voltage.

Figure 2M:
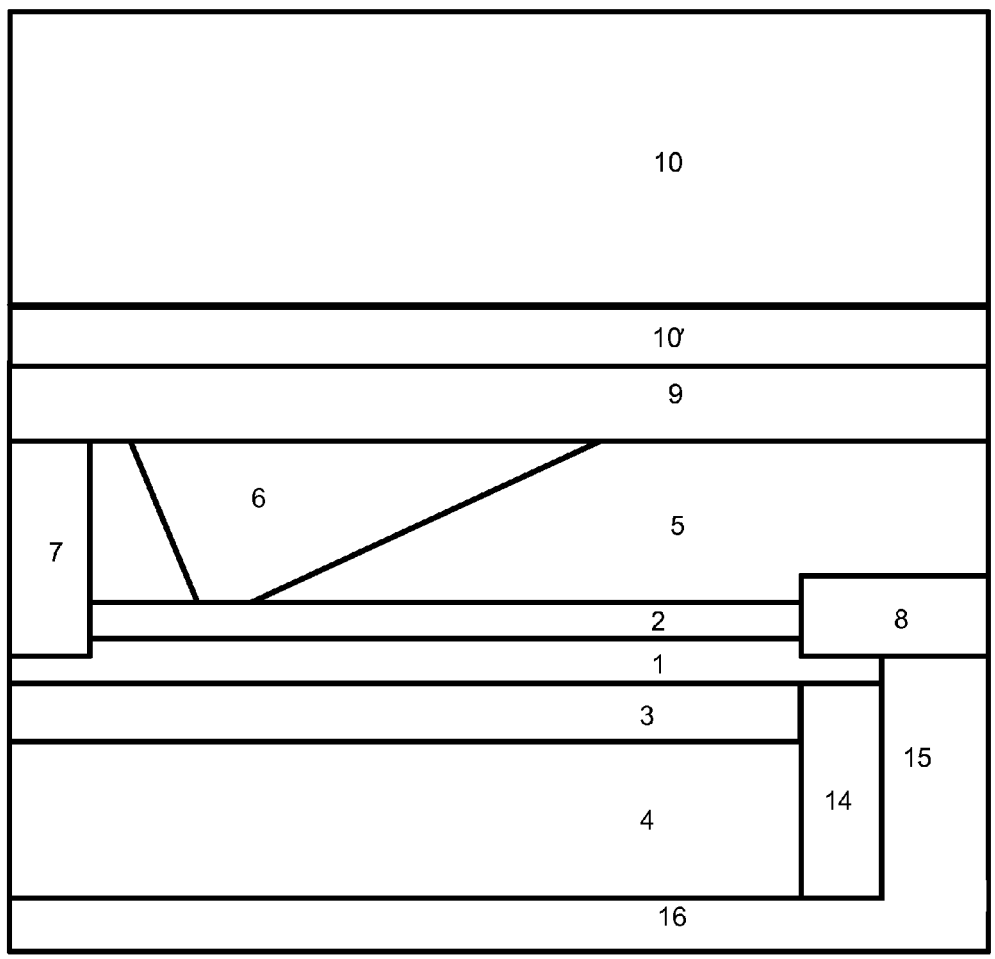

Referring to FIG. 2m, a reverse side drain contact 16 is able to interconnect multiple drain vias when multiple half cells are formed (not shown in this figure). The reverse side drain contact 16 is used for attaching the wafer to a thermally and electrically conducting layer 17. The thermally and electrically conducting layer 17 can be an adhesive layer that thermally and electrically contacts a conducting substrate 18.

The handling wafer 10 is then removed and subsequently the temporary layer 9 is selectively removed to expose the source 7 and gate 6. The source 7 and gate 6 can then be attached to bonded leads (not shown).

The wafer is then tested and scribed for downstream processing, such as die-attach and bond.

Figure 3:
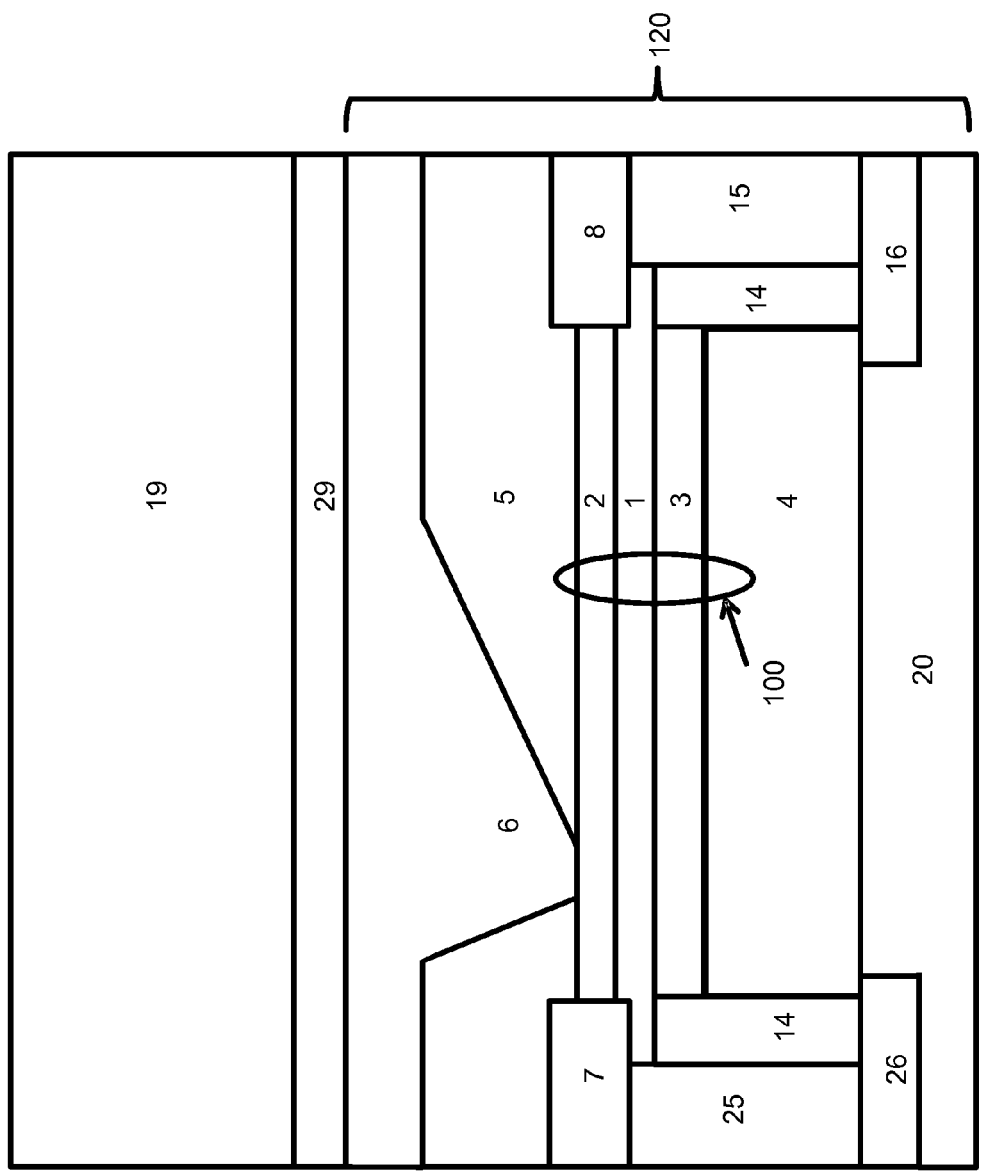
FIG. 3 shows a schematic of the cross-section of an HFET in which the gate is accessed on the obverse face while the source and drain are accessed from the reverse face.

Referring to FIG. 3 in some implementations, the gate with a sloping field plate is grounded.

The source 7 and drain 8 are both covered by the device-side passivation layer 5. The gate with integrated sloping field plate 6 extends over the device-side passivation layer 5, so that the device-side passivation layer 5 is between the source 7 and the gate 6 in a lateral direction and the device-side passivation layer 5 is between the drain 8 and the gate 6 in a lateral direction. The lateral direction is a direction perpendicular to the direction in which the main surface of the layers of the stack of III-nitride semiconductor material layers 100 extends.

The passivating insulator 14 is on the sidewall of vias that lead to the drain 8 and source 7 contacts on the obverse face of the stack of III-nitride semiconductor material layers 100. The passivating insulators 14 passivate and insulate the part of the active layer, that is, the stack of III-nitride semiconductor material layers 100, from the metal plugs 15 and 25 that respectively connect the drain contact 8 and the source contact 7 to the drain interconnect metallization 16 and the source interconnect metallization 26 on the reverse face. The reverse face is covered with a passivating dielectric layer 20 in which contact holes are open at bonding pads for the source and the drain.

Carrier wafer 19 is an electrically and thermally conducting wafer to which the obverse face of the device 120 is bonded. A bonding layer 29, which is also an electrical and thermal conductor, bonds carrier layer 19 to the gate 6 of the device 120.

Because the source is to be accessed from the reverse face, vias to the source 7 are not required on the obverse face and there is no need to cover the gate metallization with a protective coat (such as layer 9 in FIG. 2e) as in the previous process. After completing processing of the obverse face, the wafer is permanently attached to the conducting carrier wafer 19. In some implementations, the vias to the drain and source contacts can be made in the same process steps.

Figure 4:
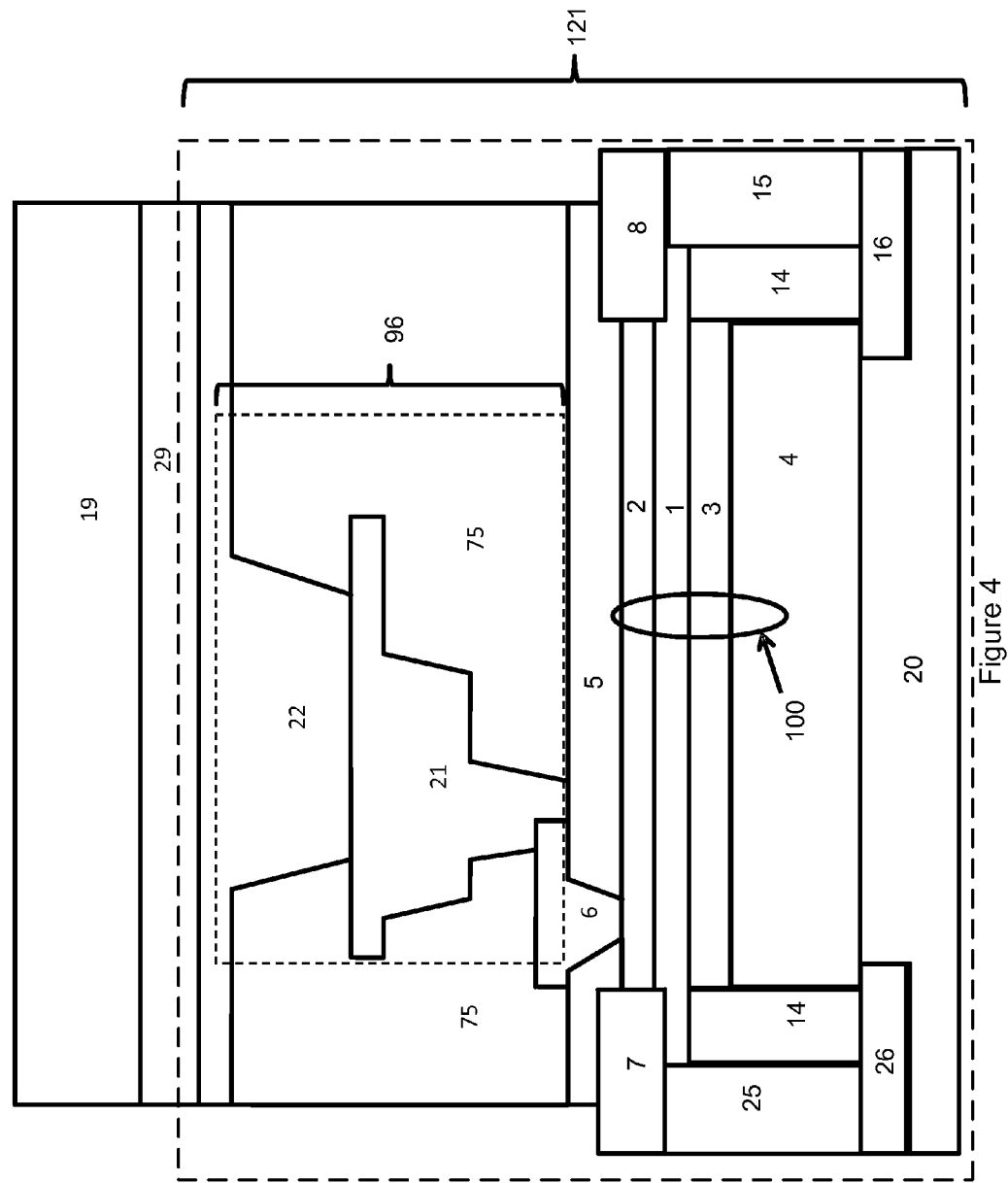
FIG. 4 shows a schematic of the cross-section of a grounded gate HFET with a stepped field plate.

Referring to FIG. 4, in some implementations, an HFET is formed with a stepped field plate connected to the grounded gate. Additional metal layers 21 and 22 are in contact with the gate 6 and with the bonding layer 29. The gate 6 along with the additional metal layers 21 and 22 form a stepped field plate 96. The stepped field plate 96 can be formed by a series of lithography steps, including partial etch of dielectric material and metal deposition. In some implementations, the stepped field plate 96 includes part of the gate layer 6 that overlays the gate dielectric 5, and metal layers 21 and 22. The stepped field plate 96 is formed of layers that are deposited in the recess of the device side passivation layer 75, which is deposited over the gate dielectric 5 and the gate 6. The passivation layer 75 can be deposited in a series of steps. A recess is formed in the passivation layer at each step of the deposition. Thus, the first field plate layer 21 is formed in a recess in one of the first sublayers of the passivation layer 75. The passivation layer 75 is further patterned and another metallization to form the second field plate layer 22 is made so that the formed field plate over the device side passivation layer 75 is in contact with the lower field plate layer 21. Because the three portions are in electrical connected with one another, they function as a single component. The stepped gate and field plate 96 can be formed from more or fewer sections than the three that are shown, using other deposit-pattern-deposit processes that form the metal or other conducting material structure in the dielectric layer. After the formation of the stepped field plate, the wafer 121 with the device fabrication complete on the obverse face is attached to a conducting carrier wafer 19 with a conducting layer 29 and the reverse face processed as for the device in FIG. 3.

Figure 5:
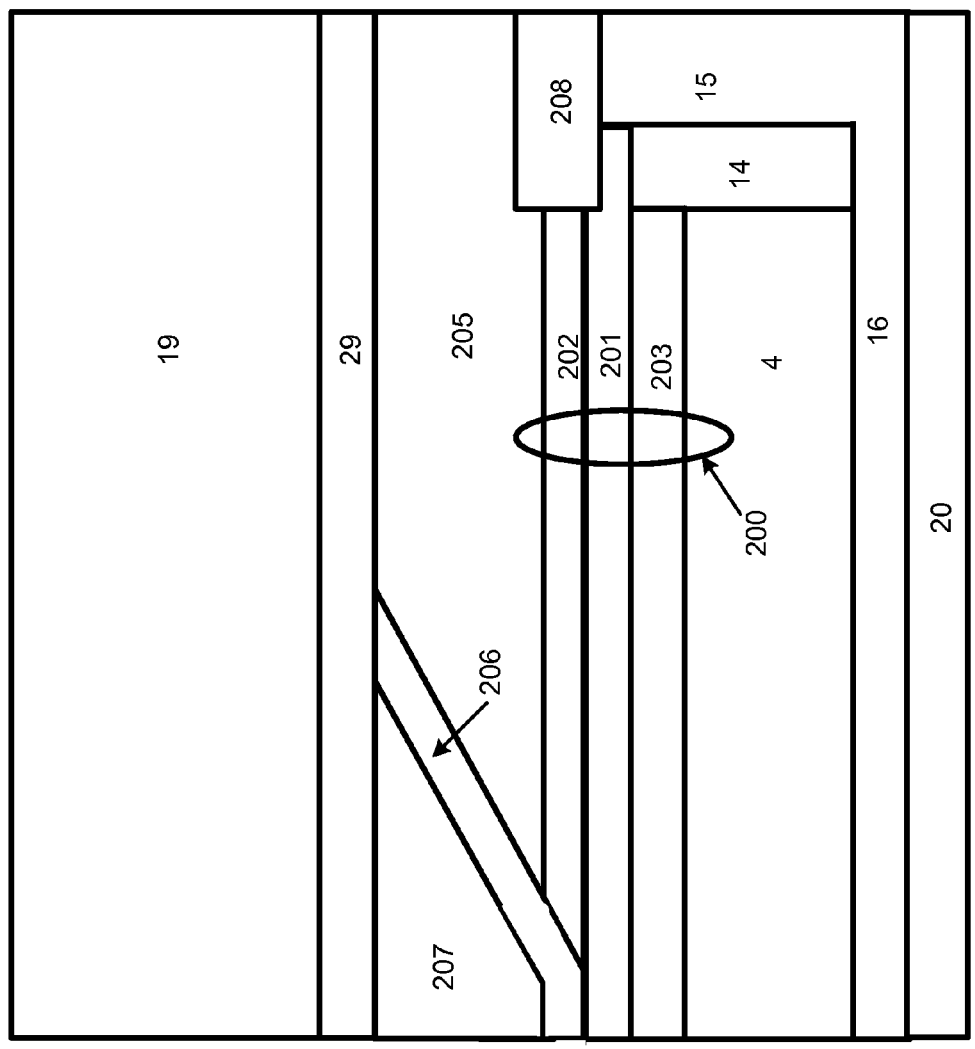
FIG. 5 shows a schematic of the cross-section of a lateral Schottky diode.

Referring to FIG. 5, a lateral Schottky diode can be formed using the techniques described herein. A Schottky diode is formed by an appropriately chosen metal making contact with a semiconductor which is called the Schottky layer. As explained below, the Schottky diode materials and structure are engineered to obtain acceptable forward voltage (such as ~0.5 V at 1 mA/mm) and forward on resistance ($R_{on}$~10 Ω/mm for a 1000 V device).

As described for the HFETs, an AlGaN|GaN|AlGaN stack forms the active layer with an ohmic contact to the 2DEG forming the cathode and the metal of the Schottky contact forming the anode. In some implementations, the top AlGaN layer is etched so that the anode metal layer makes direct contact to the Schottky layer as shown in FIG. 5. The stack of III-nitride semiconductor material forming the active layer 200 can include a Schottky layer that also serves as the barrier access layer which we shall call the Schottky-cum-access layer 201, a spacer layer 203 and a polarization induced dipole (PID) layer 202, with the Schottky-cum-access layer 201 between the spacer layer 203 and the PID layer 202. The active stack is designed so that a 2 DEG forms in the Schottky-cum-access layer when the complete sandwich is intact. In some implementations, there is a cap layer on top of PID layer 202 that has a smaller bandgap than the PID layer 202 and is unintentionally or p⁻ doped. The spacer layer 203 has a bandgap not smaller than the bandgap of the Schottky-cum-access layer 201 and can be a single or multilayer structure. The Schottky-cum-access layer 201 is an unintentional or n⁻ doped III-nitride layer which forms the Schottky layer of the diode where the anode metal 206 makes contact and the lateral access layer elsewhere, with the 2-DEG forming a low resistance access path to the cathode contact 8. The doping of the Schottky-cum-access layer affects the forward cut-in voltage of the diode. The higher the n-type doping, the lower the saturation current and the larger the forward cut-in voltage of the Schottky diode. However, as one raises the n-type doping the 2-DEG mobility drops and the access region resistivity increases.

A passivating dielectric 205 is deposited on the active layer. The dielectric layer 205 and the PID layer 202 are etched where the anode metal 206 must make a Schottky contact with the Schottky layer 201. Because the PID layer is removed, there is no polarization induced dipole and therefore 2-DEG below the anode metal 206 and a good Schottky barrier is formed. The PID layer and 2-DEG however remain in the access regions. Anode 206 is formed of a metal with a work function that provides the requisite turn-on voltage. In the example shown an integral sloping field plate is formed with the anode by the formation of a sloped recess in the passivation layer 205 before the deposition of the anode metal 206 and then a conducting metal 207 on it to reduce the on-resistance of the diode. The cathode contact is an ohmic contact 208 which is an electron collecting layer forming good electrical contact to the 2DEG in the access region. Contact 208 is a metal alloy or a highly doped n-type semiconductor with a layer of metal making an ohmic contact to the highly doped n-type semiconductor. When fabrication is complete on the obverse face, the wafer is attached to an electrically and thermally conducting carrier wafer 19 using a conducting layer 29 that makes good electrical contact with the anode metallizations 206 and 207.

The reverse face is processed using processes similar to those for the HFETs described earlier, such that the mother wafer and the defected layers are removed, a first reverse passivation layer 4 is deposited, vias are etched in it and the cathode contact brought to the reverse face using metal plug 15 and metallization 16. A second reverse face passivation layer 20 protects the reverse face and is opened only where contacts are required for one or more bonding pads for the cathode on the reverse face (not shown).

In some implementations, the diode includes an implanted guard ring in the barrier layer to reduce leakage currents.

Implementations in which the strain in the active layers can get significantly modified after total mother substrate and strain management layer removal.

In some implementations, a stiff adhesive layer is used to anchor the device face to a carrier wafer. In these implementations, polymeric dielectrics with a Young's modulus less than one hundredth that of GaN are not used for the device side passivation layer 5, because of the strain relief that can occur due to the plasticity of the dielectric. Even amorphous silicon dioxide with its Young's modulus one fifth that of GaN may be inadequate to prevent an adjacent GaN active layer, the channel layer 1 and the barrier layer 2, from strain relaxation. The stiffness of silicon nitride may be adequate to maintain strain in the active layer if it is rigidly bonded to it. However, hydrogen and nitrogen broken bonds in the silicon nitride layer can lead to trapping effects which may be undesirable in a high voltage device.

In some implementations, strain in the III-nitride active layers is maintained by using sufficiently hard and thick passivation layers, such that strain is maintained in the III-nitride layers and one can then attach the device to a carrier wafer that can handle the heat dissipation and if need be the electrical contact. Engineering the electrical, mechanical and thermal properties of the obverse and reverse face passivation layers is a challenge and again not addressed here.

In some implementations, some of the substrate on which the device is formed is retained so that a III-nitride membrane is maintained with the tensile strain created during hetero-epitaxy and cool down. This approach allows a broad spectrum of strain engineering and passivation techniques to be employed for optimizing device performance.

Figure 6:
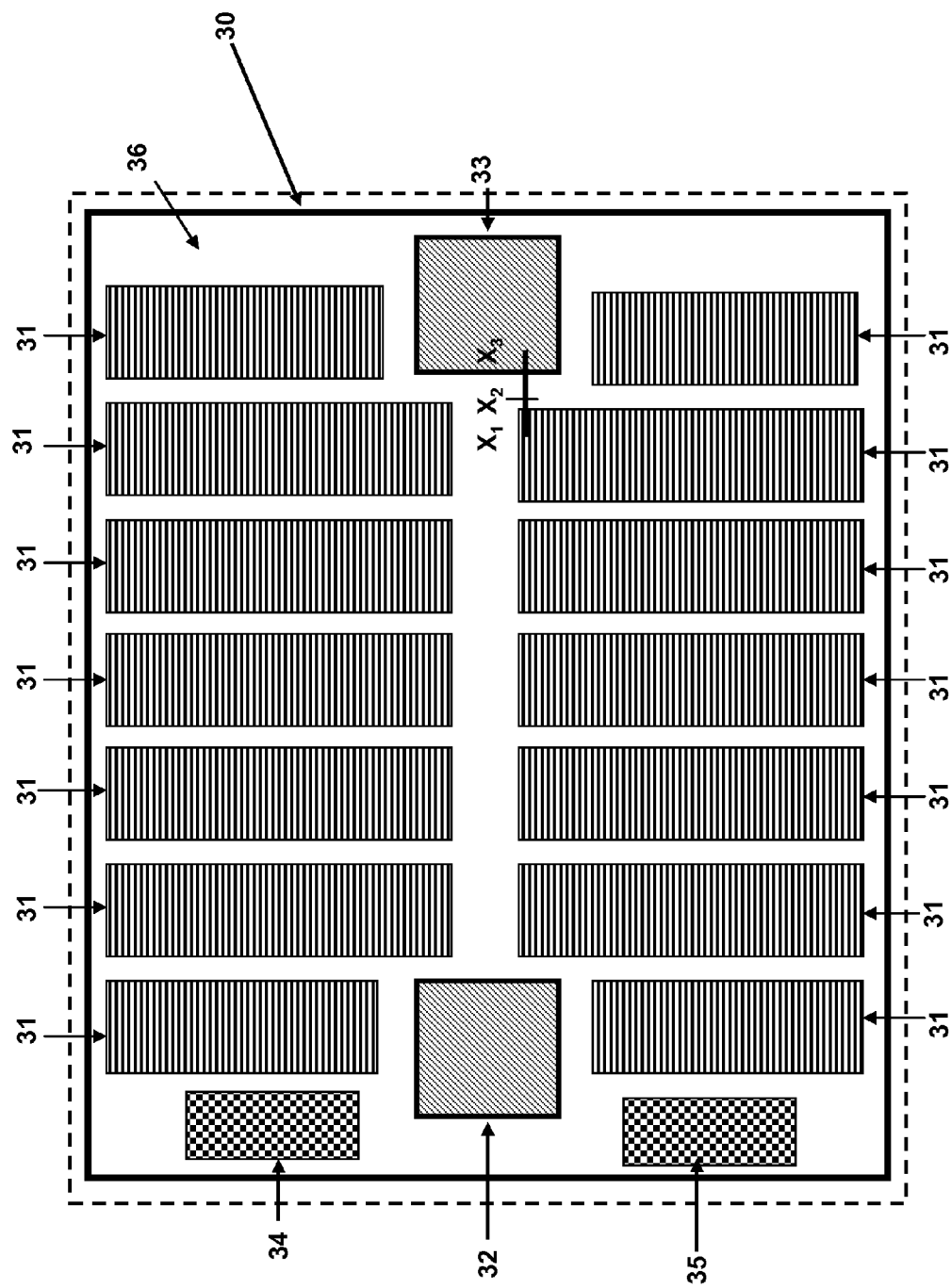
FIGS. 6 and 7 show schematics of the plan and cross-section views of an HFET in which sections of the original substrate are retained as an exoskeleton to maintain tensile strain in the active area of the device.

In some implementations, a planar exoskeleton is used to lock in-plane tensile strain in all layers of the active layer. An exemplary plan view of such a die is shown in FIG. 6. The die 30 includes cell regions 31 each including multiple cells that form the power device or other high voltage drive circuits. Each region 31 may have from a few to tens of cells with the reverse face processed such that the defected layers that have traps have been removed. Bonding pads 32, 33 for the gate and the source are at either end of the die 30. The die 30 can include more than one bonding pad for each terminal to satisfy impedance matching and current handling requirements of the power device plus control and feedback inputs and outputs if on-chip control is present. On-chip control and drive circuits that handle low voltage (such as, <30 V) which could be in the active GaN layer 34 or in the silicon below 35 (both indicated areally) are optionally placed on the die 30. Areas 36 surrounding the cell regions 31, the bonding pads 32, 33 and on-chip control and drive circuits 34, including areas below the optional silicon control electronics regions 35, indicate the areal location of the strain maintaining exoskeleton, formed by keeping portions of the substrate on which the device is formed intact.

Figure 7:
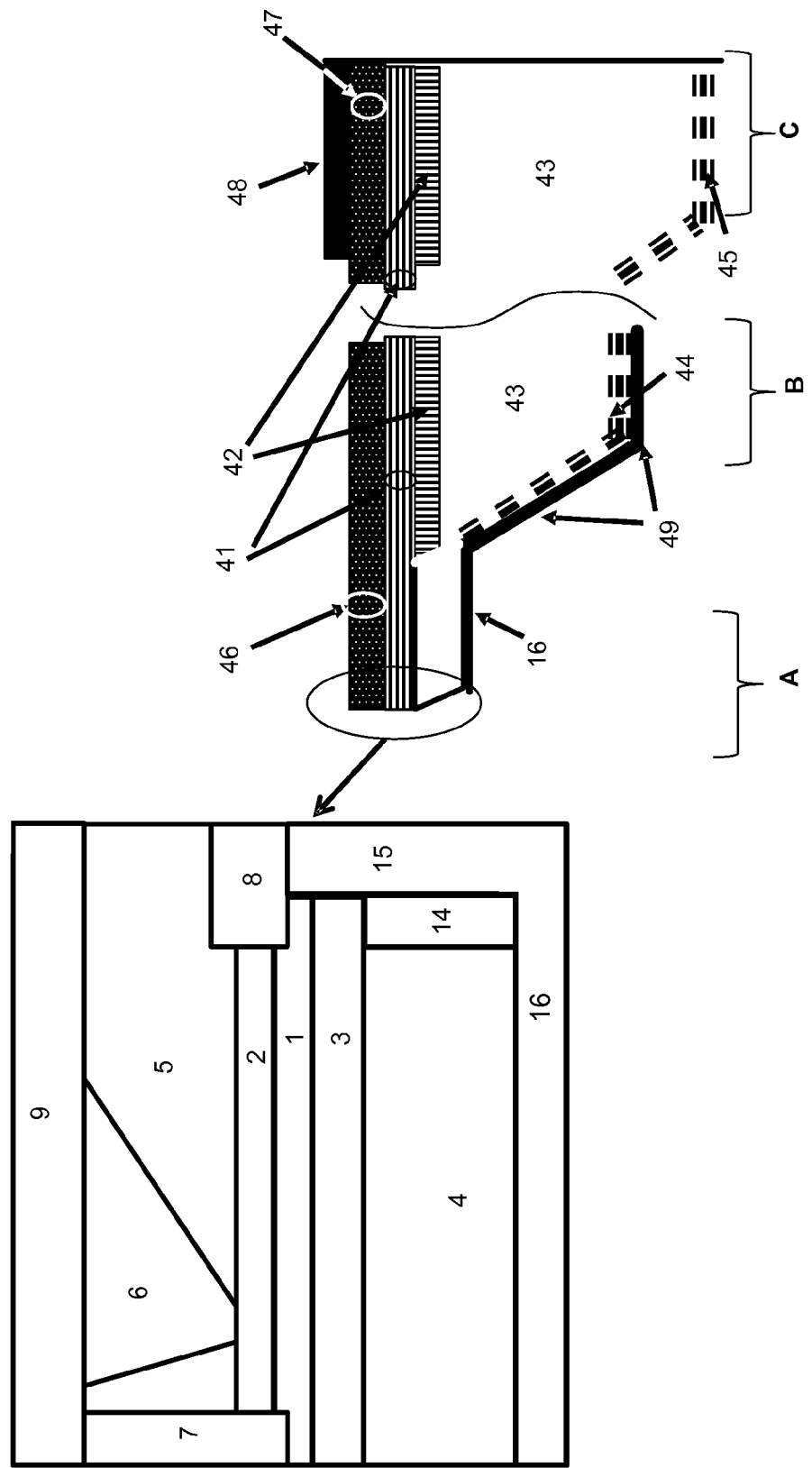

In FIG. 7 the cross-section along plane $X_1 X_2 X_3$ in FIG. 6 is shown. Cross-sections above A, B and C respectively depict the cross-sections in the active device region (around $X_1$) or the high voltage device region, the inner exoskeleton region (around $X_2$) and the outer exoskeleton region (around $X_3$ in the bond pad region). Unlike in some implementations, the metallization on the reverse face that connects the drain vias is extended to the bond/solder pads on the inner exoskeleton. Region B is the inner exoskeleton that is next to the device region (around $X_2$) and can maintain the tensile strain in the III-nitride film in the active region. A layer of silicon (43) from the mother wafer is between about 10 and 50 microns thick. This thickness enables the tensile strain to be maintained and at the same time enables the drain metallization from the active region 16 to extend over to the inner exoskeleton (Region B) through metallization 49. A thicker inner exoskeleton would require an unnecessarily large area for the sloped portion that enables reproducible and reliable interconnect coverage on the sidewall of the exoskeleton. Thick dielectric layers 44, 45 insulate the silicon 43 from the drain metallization 49. As can be seen, nucleation and stress management layers 42 are not removed in the exoskeleton regions B and C, which helps to keep the active III-nitride layer 41 firmly attached to the exoskeleton. The active III-nitride layer 41 can include channel layer 1, barrier layer 2 and spacer layer 3 and can be isolated electrically by oxygen implantation along the perimeter of the active region. Layer 46 comprises the passivation 5-metallization 6/7-passivation 9 stack of layers, which carry source or gate connections to bonding pads in Region C. Optionally, an additional areal stress management layer can be added between the perimeter of the active region and the inner perimeter of the exoskeleton.

Region C is the outer exoskeleton and it lies along the perimeter of the die 30, below bond pads on the obverse face and other regions that have low voltage electronics. As shown in FIG. 7 the outer exoskeleton retains thicker silicon from the mother wafer—the thickness being adequate to enable handling of the wafer during processing, dicing and packaging subsequent to the thinning operation while preventing damage to the assembly. For smaller wafers (such as 2" wafers) and small area dies (less than 3×3 mm$^2$), the thickness of the silicon in Regions B & C can be kept the same to reduce processing steps. As can be seen in FIG. 7, layer 47 represents the obverse face passivation 5-metallizations 6/7-passivation 9 layers with the top passivation removed near the bond pad, where an additional metal layer (48) might be added, the latter necessary for some bonding and packaging situations. Additionally, a layer of silver might be added as layer 49 if soldered contacts are needed, whereas, ultrasonic bonding could be done directly to a pad on a gold bus. In some implementations, the metallizations (6/7) are thickened at the main bus level and there may be more than one bond/solder pad for one terminal. The thicker exoskeleton can also support any low voltage control and synchronization electronics on the silicon mother wafer, such as in non-active regions of the power device.

In some implementations, the process flow can be similar in the early phase to the processes we have presented earlier. A basic high voltage device with gate and source contacts on the obverse or device face is fabricated and attached to a handling wafer with thermal or UV release polymer, as described herein. The mother substrate is thinned down on the reverse face to a desired thickness. A photoresist or oxide is selectively applied to the reverse face in Region C, such as by using a coarse double sided alignment, the exposed pockets of Regions A and B are etched, such as by a deep RIE process to the requisite depths.

A second photolithography step is performed to protect Regions B & C, and the silicon plus the nucleation and stress management layers from the Region A are removed. These layers can be removed by deep RIE and a sloping sidewall with a slope between about 30° to 75° can be formed in the silicon exoskeleton since steeper sidewalls could create discontinuities in metallization from the active region to the inner exoskeleton as explained earlier. Completion of etch through a layer can be conveniently determined by end point detectors based on measuring the intensity of silicon or gallium emissions. The etch process is terminated by either a wet etch or a nitrogen plasma low temperature anneal to reduce defect generation in the active layers.

Once the active layers are exposed on the reverse side, a thick layer, e.g., a layer about 15 μm thick on 1000 V device, of passivating strain-free insulator, such as silicon dioxide or silicon oxynitride, is deposited using a chemical vapor deposition technique such as ICP-CVD. The handling wafer is detached and the deposited dielectric is densified by either a thermal or excimer laser anneal to improve passivation at high fields and reduce long term moisture diffusion—thence device drift—into the passivation layer. The handling wafer can be reused.

A via to the drain contact is made on the reverse face to the drain metallization on the obverse face, the sidewalls passivated, and the via is filled with metal such as copper or gold. A patterned metallization that connects the drain via to the bond/solder pads on the inner exoskeleton is formed. If required an additional bond/solder pad metallization is performed and only the bond pads exposed through a final passivation layer. Devices are tested and diced for downstream processes.

In some implementations, the metallization occurs late in the process of forming the device, but can enable a much higher quality passivation, produce devices with higher breakdown voltage and lower trapping (thence lesser current collapse and hysteresis in characteristics), utilize fewer process steps, does not require an expensive double sided aligner and can enable better integration of silicon and III-nitride processes.

Figure 8A:
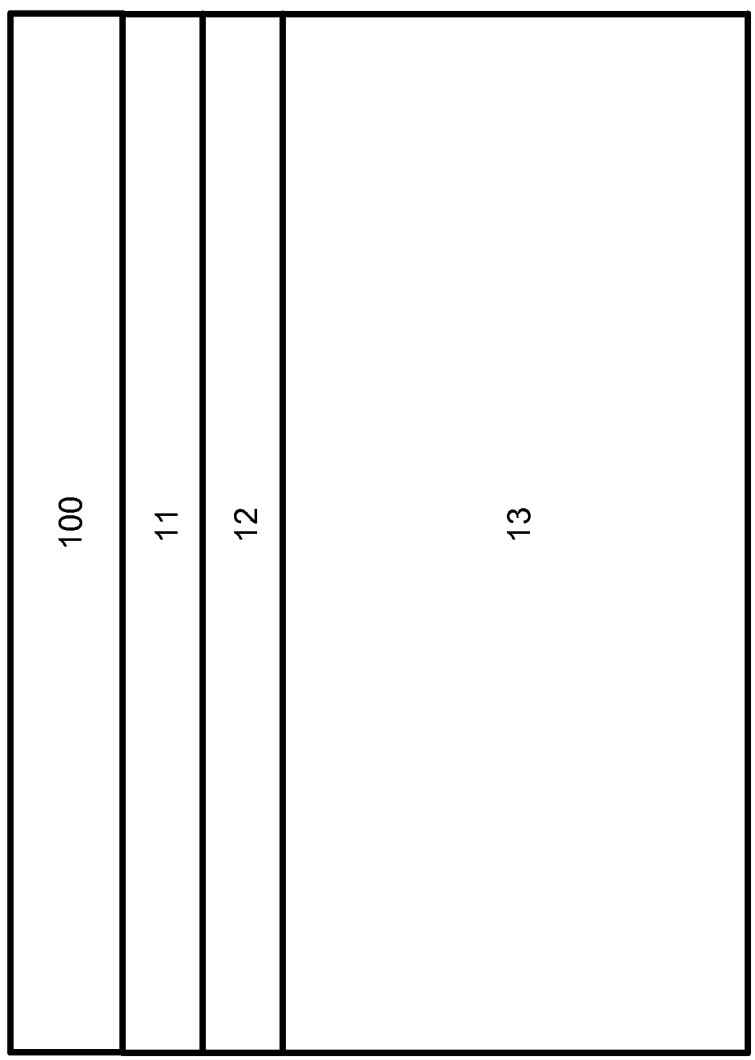

Referring to FIG. 8a, the active layer 100 is grown by heteroepitaxy on a support stack of a <111> silicon mother wafer 13, a nucleation layer 12 and a stress management layer 11. The active layer 100 comprises three essential layers, with acceptably low defect density, that are the spacer layer, the channel layer and the obverse barrier layer, plus other optional layers that might include a reverse barrier layer, a cap layer and a alloy scattering screening layer.

Referring to FIG. 8b, a passivation stack 105 is a sandwich of one or more inorganic dielectrics such as aluminum nitride, silicon nitride and silicon dioxide. The passivation stack 105 can be deposited by a low to moderate temperature CVD process.

Figure 8C:
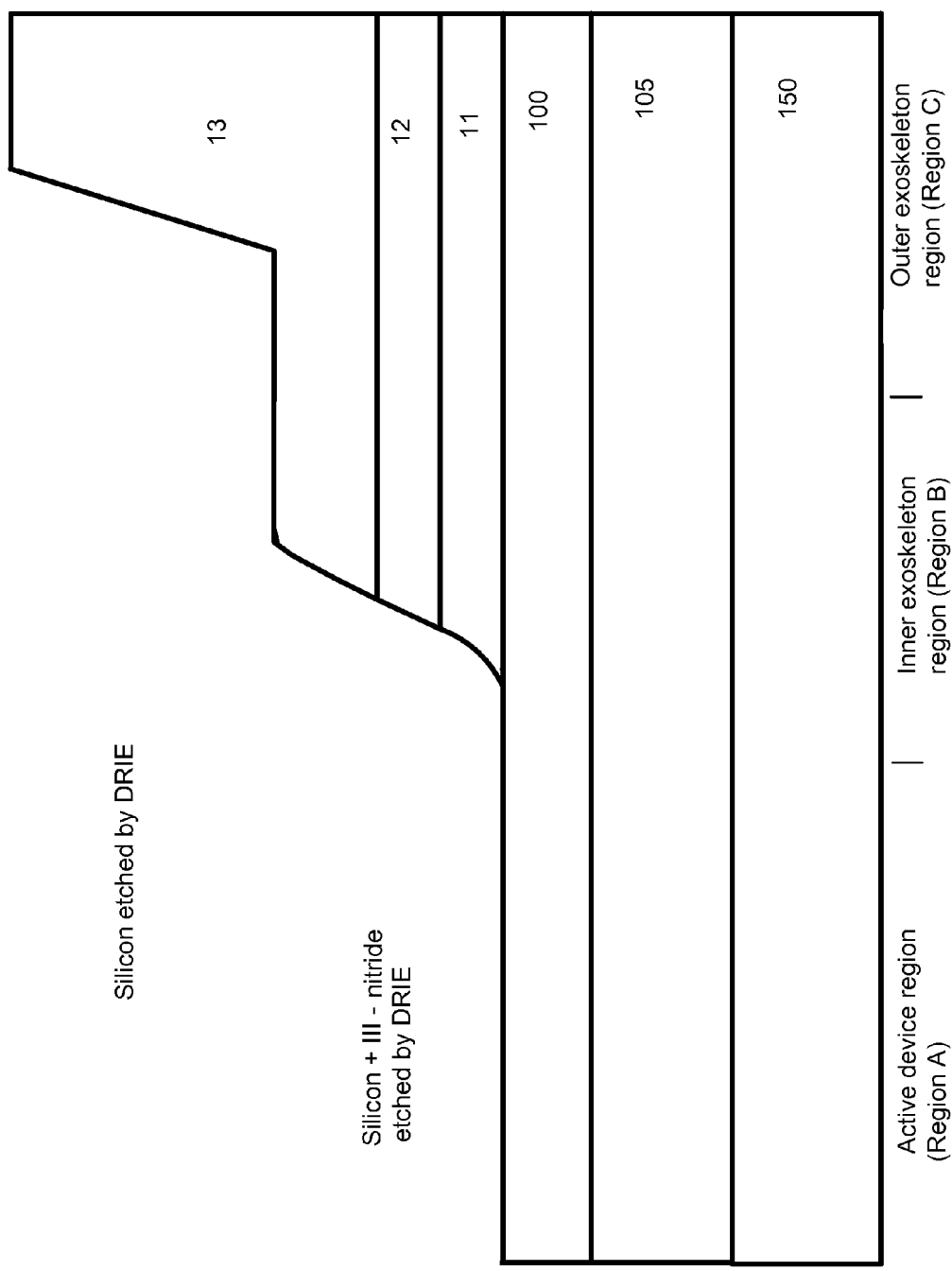

Referring to FIG. 8c, which shows the cross section spanning the active region, the inner exoskeleton and the outer exoskeleton after the reverse face is processed. The obverse face of the wafer is attached by a UV sensitive adhesive layer (not shown) to a double sided polished quartz wafer 150. A photoresist pattern is used to protect a region of the mother wafer 13 that will form the outer exoskeleton and expose regions that will form the inner exoskeleton. The exposed silicon is etched, such as with a deep reactive ion etch process, for example, the Bosch process until the desired thickness of the inner exoskeleton is reached. A second lithography step is performed to pattern the active areas and the remaining silicon and nucleation and stress management III-nitride layers are removed by dry and wet etching, leaving only the active layer intact.

Referring to FIG. 8d, a conformal coating of a sandwich of inorganic dielectric material is deposited to form passivation layer 51, such as by a low temperature remote plasma CVD process on the micromachined reverse face. The quartz handling wafer is then detached. If the adhesive was a UV decomposable polymeric adhesive, UV light is shone on the adhesive through the quartz wafer 150, causing the adhesive to lose its adhesive quality. This is followed by a medium temperature anneal to densify the passivation layers and reduce dielectric traps and fixed oxide charges.

Figure 8E:
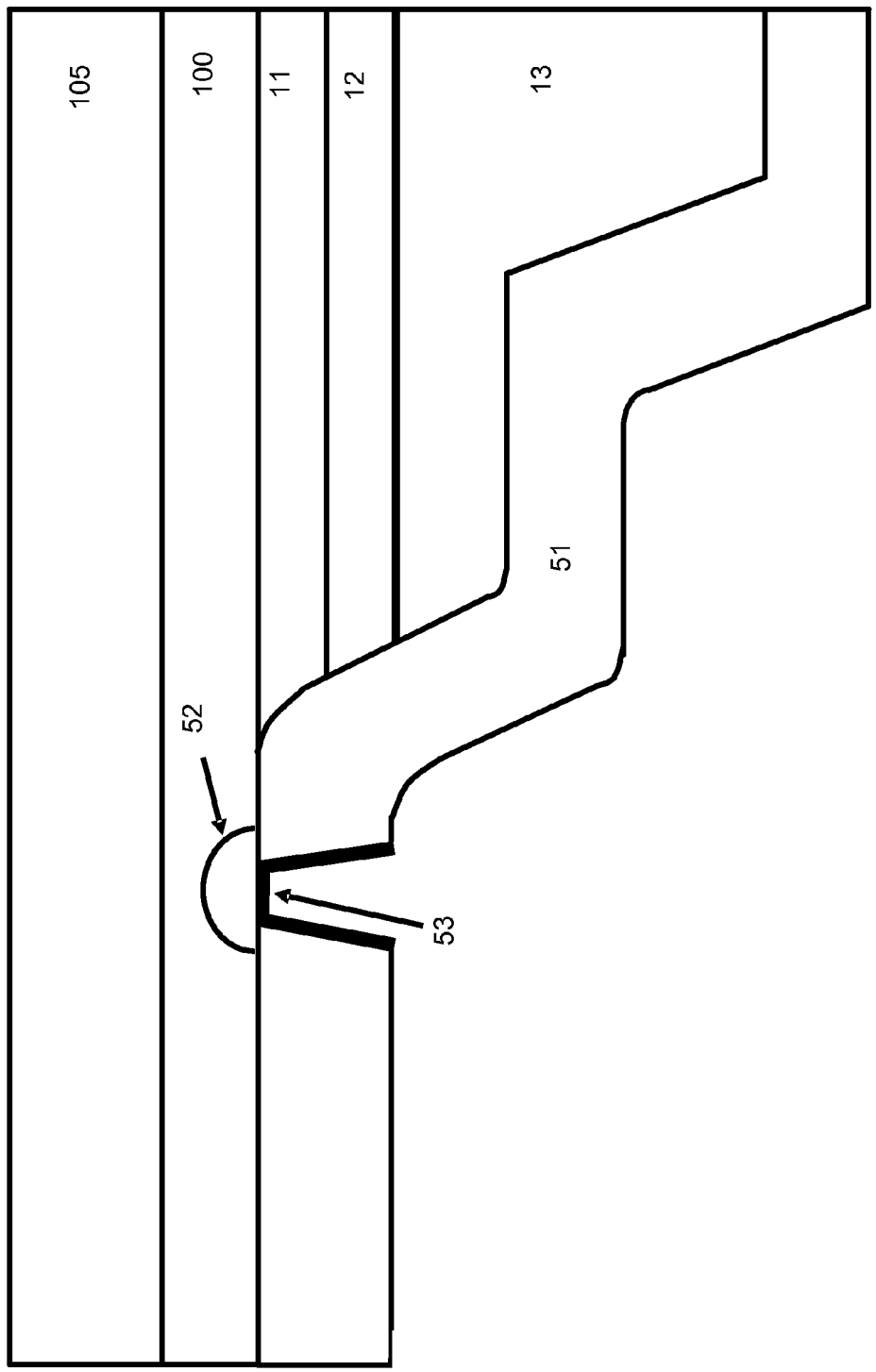

Referring to FIG. 8e, the passivation layer 51 is patterned for implantation of an n$^+$-drain 52, the field shaping region and contact to the 2DEG layer which is closer to the obverse side. A high temperature anneal is used for implant activation and to reduce traps in inorganic dielectrics. The high temperature anneal produces a far higher quality dielectric than is possible by lower temperature anneals. High temperature annealing, that is annealing at temperatures over 750° C. may not be possible after metallization, because the high temperatures can cause the metallization to melt or alloy, and so cannot be done with the early metallization processes described previously. Nor can moderate or high temperature anneals be used subsequent to the deposition of polymers as passivation layers.

Figure 8F:
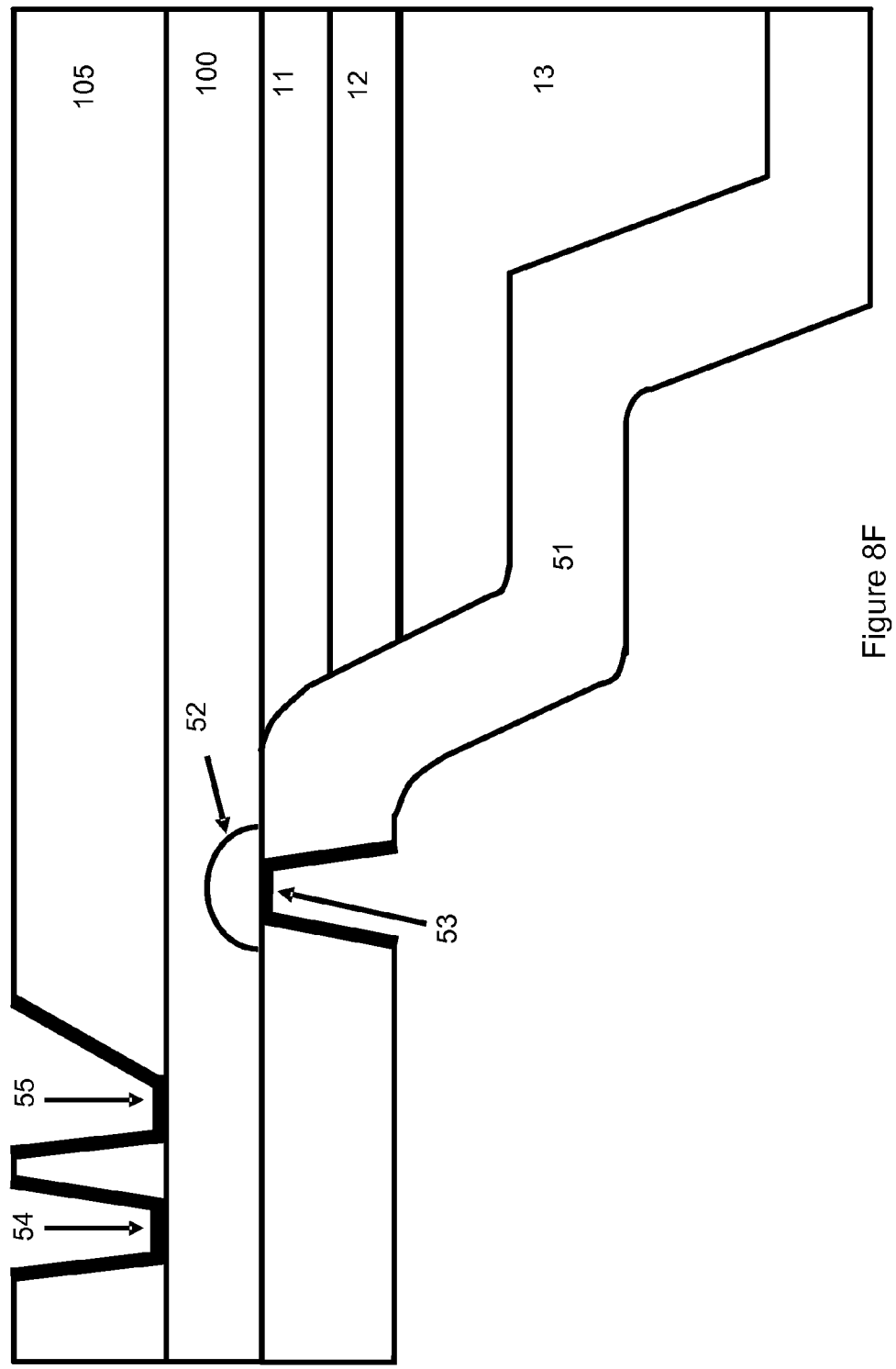

The reverse face is patterned and metalized to form the drain ohmic contact 53, as shown in FIG. 8e. Referring to FIG. 8f, the obverse face is patterned and metalized to form the source ohmic contact 54. The wafer is optionally annealed at a high temperature for a short time after metallization to form good ohmic contacts to both the source and drain in the active layer 100 next to metallizations 54 and 53. The obverse face is further patterned for the Schottky gate metallization 55, if need be, by depositing it over a thin gate dielectric. The Schottky gate metallization 55 formation can be followed by a mid temperature anneal (400-600° C.) to improve the Schottky barrier interface.

The wafer is patterned on both faces and the metallization to form busses and bond/solder pads is thickened by electro or electroless deposition. Both faces of the wafer are passivated, such as by using a low temperature CVD deposition of silicon nitride or depositing some other capping passivation dielectric. Contact holes are opened to the bond/solder pads. The wafer is diced for downstream package and test processes. A modification of the process for medium voltage power devices can include forming the gate, source and drain access on the obverse face. The n+-drain implant and the drain metallization are both on the obverse face. In other implementations, metal alloys for the ohmic contacts and the gate metal require similar post-metallization anneal conditions and that enables further simplification of the process sequence.

Further modifications of the process can include fabrication of control, synchronization and drive electronics on the silicon exoskeleton if silicon devices are required. In some implementations, control, synchronization and drive electronics could be hybrid silicon-GaN or only GaN with the low voltage GaN devices located in the active regions or the exoskeleton regions. Yet another modification of the device forms the source and drain access on the reverse face.

A lateral Schottky diode with the barrier accessed by one or more 2DEG layers can be formed using the methods described herein. The anode can be accessed on the obverse face and the cathode the reverse face. Nucleation and stress management layers are grown by heteroepitaxy followed by a p-type/unintentionally doped GaN layer, an unintentionally doped AlGaN layer, an unintentionally or lightly doped GaN layer and an in situ silicon nitride layer. The device area is delineated by implant or mesa isolation. Additional dielectric layers can be deposited. The dielectric layers are removed after patterning and the metal forming the ohmic contact with the 2DEG is deposited and annealed. The obverse face is then patterned for the Schottky contact and the dielectric layers are removed by etching. Optionally, another lithography step is performed to define a guard ring, after which the metal to form the Schottky barrier is deposited and annealed. Next, a thick dielectric is deposited and patterned to expose areas where the metal needs to be thickened. The anode electrode bus is further thickened by electroless plating of nickel or gold. The wafer is planarized until the top of the thickened metal and a metal coating is exposed. This face is then attached to an electrically and thermally conducting wafer using a conducting interlayer. The wafer on the obverse face is protected by an appropriate coating and the original substrate is removed by etching.

The nucleation and stress management layers are etched and the reverse surface is treated with an appropriate wet etch or nitrogen plasma to remove residual surface damage and charge. The reverse face is next suitably passivated with silicon nitride or aluminum nitride and if need be an additional layer of silicon dioxide. Other organic, such as BCB, or inorganic, such as alumina, dielectrics can alternatively or also be used. One or more vias through the passivation layer and the underlying group III-nitride layers are etched to the cathode bus. Terminal metallization is performed with a two step deposit and plate process. The wafer is then sawed to form separate dies for downstream processing.

For a transistor (HFET/HEMT) with access to the source and gate on the device face and the drain on the reverse face, the process of formation can be as follows. Nucleation and stress management layers are grown by heteroepitaxy followed by a p-type/unintentionally doped GaN layer, an unintentionally doped AlGaN layer, an unintentionally or lightly doped GaN layer and finally an in situ silicon nitride layer. Additional dielectric layers can be deposited. After implant isolation, dielectric layers are removed. After patterning and the metal forming the ohmic source and drain contacts with the 2DEG is deposited and annealed. The obverse face is then patterned for the Schottky gate contact between the source and drain and the dielectric layers are removed by etching. This can be followed by another lithography step to define a field plate, after which the metal to form the gate contact is deposited and annealed. Dielectric deposition and patterning is then performed to form the gate interconnect and bus. The gate and source electrode busses are further thickened by electroless plating of nickel or gold or copper. Next a thick dielectric is deposited and the wafer is planarized until the top of the thickened metal is exposed.

The wafer is then attached to a handling wafer. The wafer on the obverse face is protected by an appropriate coating and the original substrate is removed by etching. The nucleation and stress management layers are etched and the reverse surface is treated with an appropriate wet etch or nitrogen plasma to remove residual surface damage and charge. The reverse face is next suitably passivated with silicon nitride or aluminum nitride and if need be an additional layer of silicon dioxide. Other organic, such as BCB, or inorganic, such as alumina, dielectrics can also be used. One or more vias through the passivation layer and the underlying group III nitride layers are etched to the drain bus and via filled with metal plug. The reverse face is then bonded to an electrically and thermally conducting substrate so that the drain vias are in electrical contact with the wafer and the dielectrics in mechanical contact. The handling wafer is then removed to expose the source and gate metallization busses. The top is then coated with a organic or inorganic passivation layer that is open at only the source and gate bonding pads. The wafer is then sawed to form separate dies for downstream processing.

A number of implementations and techniques have been described herein. Modifications to the techniques and devices can include one or more of the following. An etch stop layer, such as a layer of AlGaN, can be inserted into the spacer layer 3 to facilitate backside selective dry etching using fluoride- and chloride-based chemistry mixtures. This can provide better control of the remaining thickness of the spacer layer after the backside processing. Another possible modification is to introduce an insulating dielectric layer under the gate 6 to suppress gate leakage current. Possible gate dielectric includes but are not limited to silicon nitride, silicon oxide, aluminum nitride, aluminum oxide, gallium oxide and high K dielectrics. An epitaxially grown III-nitride semiconductor layer instead of a dielectric layer to form device side passivation layer 5. A field-reducing plate can be applied on the reverse side passivation layer 4 for the grounded gate. The field plate can be connected either to the source or to the gate. This field plate layer overlaps gate 6 on the obverse face. A certain lateral distance can be kept between the field plate layer and the drain 8 on the obverse face so that there is no shorting at high voltages. The III-nitride layers can be grown as nitrogen faced layers, as described in U.S. application Ser. No. 12/209,504, filed on Sep. 12, 2008, and is incorporated herein by reference, instead of III-face layers. Alternatively, the III-nitride layers can be grown with non-polar m-plane or a-plane, or semi-polar faces instead of c-plane faces. The channel layer 1 can be modulation doped in structures in which there is no polarization charge due to strain collapse or due to use of a non-polar face orientation of the III-nitride active layer. There are various combinations of the electrode structures for lateral devices. Some of the devices that exploit the advantages of a wafer level flip-chip process with defected layer removal and passivation are: FETs, such as HFET, MISFET or JFET devices, with gate and source contacts accessed on the device face and the drain contact accessed on the reverse face, and Schottky diodes with the cathode accessed via the reverse face and the anode accessed via the device face. Other combinations of gate, source, drain or anode and cathode locations are possible as well. For example, the gate, source and drain can all be on either the obverse or the reverse face. Alternatively, the drain and gate can be on one side, such as the reverse side, while the source can be on the opposite side, such as the obverse side, or vice versa. In a diode, the cathode can be on the obverse face and the anode on the reverse face. As is obvious to technologists conversant with the art, other combinations of electrode access are possible, the optimum depending on the device layout, configuration and application.

What is claimed is:

1. A method of forming a device, comprising:
providing a mother wafer;
forming a stack of III-nitride layers on the mother wafer, wherein the forming of the stack includes forming a channel layer with a 2DEG channel therein, the stack of III-nitride layers having an obverse face opposite to the mother wafer and a reverse face opposite the obverse face;
forming a source and a drain on the obverse face of the stack of III-nitride layers, each of the source and the drain being in electrical contact with the channel layer, wherein the drain is spaced apart from the source such that a first region of the device is between the source and the drain;
exposing the reverse face of the stack of III-nitride layers in the first region of the device by removing at least the mother wafer from the first region of the device; and
forming, in the first region of the device, a passivation layer comprising dielectric material, the passivation layer being formed on the exposed reverse face of the stack of III-nitride layers, in direct contact with the stack of III-nitride layers in the first region of the device.

2. The method of claim 1, wherein:
the stack of III-nitride layers includes a barrier layer on a first side of the channel layer and a spacer layer on a second side of the channel layer;
the spacer layer includes an etch stop layer; and
the removing step etches to the etch stop layer.

3. The method of claim 1, wherein the mother wafer is a silicon mother wafer.

4. The method of claim 1, wherein the forming of the stack of III-nitride layers comprises forming a nucleation layer on the mother wafer.

5. The method of claim 4, further comprising removing the nucleation layer in the first region of the device.

6. The method of claim 1, further comprising fabricating one of a diode or a transistor in the stack of III-nitride layers.

7. The method of claim 1, wherein the dielectric material comprises silicon nitride, silicon dioxide, silicon oxynitride, silicon oxide, or alumina.

8. The method of claim 1, wherein the dielectric material comprises polymide, benzocyclobutene, SU8, or an organic dielectric material.

9. The method of claim 1, further comprising depositing an insulator material on the obverse face.

* * * * *

UNITED STATES PATENT AND TRADEMARK OFFICE
CERTIFICATE OF CORRECTION

PATENT NO. : 9,496,137 B2  Page 1 of 1
APPLICATION NO. : 13/756284
DATED : November 15, 2016
INVENTOR(S) : Rongming Chu et al.

It is certified that error appears in the above-identified patent and that said Letters Patent is hereby corrected as shown below:

In the Claims

In Column 18 Line 27 Claim 8, delete "polymide," and insert --polyimide,-- therefor.

Signed and Sealed this
Twenty-fourth Day of January, 2017

Michelle K. Lee
*Director of the United States Patent and Trademark Office*